United States Patent
Nagabhirava et al.

(10) Patent No.: US 12,261,044 B2
(45) Date of Patent: Mar. 25, 2025

(54) MULTI-LAYER HARDMASK FOR DEFECT REDUCTION IN EUV PATTERNING

(71) Applicants: Lam Research Corporation, Fremont, CA (US); International Business Machines Corporation, Armonk, NY (US)

(72) Inventors: Bhaskar Nagabhirava, Tigard, OR (US); Phillip Friddle, Clifton Park, NY (US); Ekimini Anuja De Silva, Slingerlands, NY (US); Jennifer Church, Armonk, NY (US); Dominik Metzler, Saratoga Springs, NY (US); Nelson Felix, Slingerlands, NY (US)

(73) Assignees: Lam Research Corporation, Fremont, CA (US); International Business Machines Corporation, Armonk, NY (US)

( * ) Notice: Subject to any disclaimer, the term of this patent is extended or adjusted under 35 U.S.C. 154(b) by 270 days.

(21) Appl. No.: 17/759,896

(22) PCT Filed: Feb. 23, 2021

(86) PCT No.: PCT/US2021/019245
§ 371 (c)(1),
(2) Date: Aug. 1, 2022

(87) PCT Pub. No.: WO2021/173557
PCT Pub. Date: Sep. 2, 2021

(65) Prior Publication Data
US 2023/0343593 A1    Oct. 26, 2023

Related U.S. Application Data

(60) Provisional application No. 62/982,956, filed on Feb. 28, 2020.

(51) Int. Cl.
*H01L 21/033* (2006.01)
*H01J 37/32* (2006.01)
*H01L 21/311* (2006.01)

(52) U.S. Cl.
CPC .... *H01L 21/0332* (2013.01); *H01J 37/32899* (2013.01); *H01J 37/32926* (2013.01);
(Continued)

(58) Field of Classification Search
None
See application file for complete search history.

(56) References Cited

U.S. PATENT DOCUMENTS

| 3,442,648 A | 5/1969 | Smith et al. |
| 3,513,010 A | 5/1970 | Notley et al. |

(Continued)

FOREIGN PATENT DOCUMENTS

| CN | 1904727 A | 1/2007 |
| CN | 101473426 A | 7/2009 |

(Continued)

OTHER PUBLICATIONS

Chinese Decision of Final Rejection dated Mar. 17, 2021 issued in Application No. CN 201611177683.3.
(Continued)

*Primary Examiner* — Binh X Tran
(74) *Attorney, Agent, or Firm* — Weaver Austin Villeneuve & Sampson LLP

(57) ABSTRACT

Various embodiments herein relate to methods, apparatus, and systems that utilize a multi-layer hardmask in the context of patterning a semiconductor substrate using extreme ultraviolet photoresist. The multi-layer hardmask includes (1) an upper layer that includes a metal-containing material such as a metal oxide, a metal nitride, or a metal oxynitride, and (2) a lower layer that includes an inorganic
(Continued)

dielectric silicon-containing material. Together, these layers of the multi-layer hardmask provide excellent etch selectivity and reduce formation of defects such as microbridges and line breaks. Certain embodiments relate to deposition of the multi-layer hardmask. Other embodiments relate to etching of the multi-layer hardmask. Some embodiments involve both deposition and etching of the multi-layer hardmask.

21 Claims, 11 Drawing Sheets

(52) U.S. Cl.
CPC .. *H01L 21/31116* (2013.01); *H01L 21/31144* (2013.01); *H01J 2237/334* (2013.01)

(56) References Cited

U.S. PATENT DOCUMENTS

| | | |
|---|---|---|
| 3,529,963 A | 9/1970 | Marchese et al. |
| 3,576,755 A | 4/1971 | Patella et al. |
| 3,720,515 A | 3/1973 | Stanley |
| 4,241,165 A | 12/1980 | Hughes et al. |
| 4,328,298 A | 5/1982 | Nester |
| 4,341,592 A | 7/1982 | Shortes et al. |
| 4,590,149 A | 5/1986 | Nakane et al. |
| 4,738,748 A | 4/1988 | Kisa |
| 4,806,456 A | 2/1989 | Katoh |
| 4,834,834 A | 5/1989 | Ehrlich et al. |
| 4,842,989 A | 6/1989 | Taniguchi et al. |
| 4,845,053 A | 7/1989 | Zajac |
| 4,940,854 A | 7/1990 | Debe |
| 5,077,085 A | 12/1991 | Schnur et al. |
| 5,322,765 A | 6/1994 | Clecak et al. |
| 5,445,988 A | 8/1995 | Schwalke |
| 5,534,312 A | 7/1996 | Hill et al. |
| 5,914,278 A | 6/1999 | Boitnott et al. |
| 5,925,494 A | 7/1999 | Horn |
| 6,017,553 A | 1/2000 | Burrell et al. |
| 6,030,881 A | 2/2000 | Papasouliotis et al. |
| 6,033,952 A | 3/2000 | Yasumura et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,261,723 B1 | 7/2001 | George et al. |
| 6,261,938 B1 | 7/2001 | Beauvais et al. |
| 6,290,779 B1 | 9/2001 | Saleh et al. |
| 6,348,239 B1 | 2/2002 | Hill et al. |
| 6,448,097 B1 | 9/2002 | Singh et al. |
| 6,573,030 B1 | 6/2003 | Fairbairn et al. |
| 6,607,867 B1 | 8/2003 | Kim et al. |
| 6,797,439 B1 | 9/2004 | Alpay |
| 6,841,341 B2 | 1/2005 | Fairbairn et al. |
| 6,841,943 B2 | 1/2005 | Vahedi et al. |
| 7,169,440 B2 | 1/2007 | Balasubramaniam et al. |
| 7,223,526 B2 | 5/2007 | Fairbairn et al. |
| 7,307,695 B2 | 12/2007 | Hazenberg et al. |
| 7,335,462 B2 | 2/2008 | Fairbairn et al. |
| 7,608,367 B1 | 10/2009 | Aigeldinger et al. |
| 7,901,736 B2 | 3/2011 | Maula et al. |
| 8,465,903 B2 | 6/2013 | Weidman et al. |
| 8,536,068 B2 | 9/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,722,543 B2 | 5/2014 | Belen et al. |
| 8,808,561 B2 | 8/2014 | Kanarik |
| 8,883,028 B2 | 11/2014 | Kanarik |
| 8,883,405 B2 | 11/2014 | Shiobara |
| 9,023,731 B2 | 5/2015 | Ji et al. |
| 9,034,748 B2 | 5/2015 | Baiocco et al. |
| 9,261,784 B2 | 2/2016 | Wuister et al. |
| 9,310,684 B2 | 4/2016 | Meyers et al. |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,778,561 B2 | 10/2017 | Marks et al. |
| 9,823,564 B2 | 11/2017 | Stowers et al. |
| 9,922,839 B2 | 3/2018 | Wise et al. |
| 9,996,004 B2 | 6/2018 | Smith et al. |
| 10,025,179 B2 | 7/2018 | Meyers et al. |
| 10,062,602 B2 | 8/2018 | Posseme et al. |
| 10,228,618 B2 | 3/2019 | Meyers et al. |
| 10,297,440 B2 | 5/2019 | Yamazaki et al. |
| 10,416,554 B2 | 9/2019 | Meyers et al. |
| 10,438,807 B2 | 10/2019 | Wise et al. |
| 10,514,598 B2 | 12/2019 | Marks et al. |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,825,680 B2 | 11/2020 | Kabansky et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 11,705,332 B2 | 7/2023 | Kuo et al. |
| 12,062,538 B2 | 8/2024 | Yu et al. |
| 12,125,711 B2 | 10/2024 | Zhou et al. |
| 2001/0024769 A1 | 9/2001 | Donoghue et al. |
| 2002/0017243 A1 | 2/2002 | Pyo |
| 2002/0180372 A1 | 12/2002 | Yamazaki |
| 2003/0008246 A1 | 1/2003 | Cheng et al. |
| 2003/0183244 A1 | 10/2003 | Rossman |
| 2003/0211752 A1 | 11/2003 | Rattner et al. |
| 2004/0043581 A1 | 3/2004 | Lin et al. |
| 2004/0113087 A1 | 6/2004 | Ikeda et al. |
| 2004/0175631 A1 | 9/2004 | Crocker et al. |
| 2004/0191423 A1 | 9/2004 | Ruan et al. |
| 2004/0213563 A1 | 10/2004 | Irie |
| 2005/0103748 A1 | 5/2005 | Yamaguchi et al. |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2006/0001064 A1 | 1/2006 | Hill et al. |
| 2006/0068173 A1 | 3/2006 | Kajiyama et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0199082 A1 | 9/2006 | Flanigan et al. |
| 2006/0205220 A1 | 9/2006 | Hudson et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0049017 A1 | 3/2007 | Hsieh |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0287073 A1 | 12/2007 | Goodwin |
| 2008/0045022 A1 | 2/2008 | Kurihara et al. |
| 2008/0070128 A1 | 3/2008 | Wu et al. |
| 2008/0157011 A1 | 7/2008 | Nagai et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0275202 A1 | 11/2009 | Tanaka et al. |
| 2009/0286400 A1 | 11/2009 | Heo et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0022078 A1 | 1/2010 | Rockenberger et al. |

(56) References Cited

U.S. PATENT DOCUMENTS

| | | |
|---|---|---|
| 2010/0131093 A1 | 5/2010 | Yokoyama et al. |
| 2010/0197135 A1 | 8/2010 | Ishizaka |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0045672 A1 | 2/2011 | Srinivasan et al. |
| 2011/0059617 A1 | 3/2011 | Mitchell et al. |
| 2011/0104595 A1 | 5/2011 | Hayashi et al. |
| 2011/0117702 A1 | 5/2011 | Rietzler et al. |
| 2011/0198756 A1 | 8/2011 | Thenappan et al. |
| 2011/0207323 A1 | 8/2011 | Ditizio |
| 2011/0209725 A1 | 9/2011 | Kim et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1 | 1/2013 | Nemani et al. |
| 2013/0109186 A1 | 5/2013 | Zhang et al. |
| 2013/0129995 A1 | 5/2013 | Ouattara et al. |
| 2013/0157177 A1 | 6/2013 | Yu et al. |
| 2013/0177847 A1 | 7/2013 | Chatterjee et al. |
| 2013/0224652 A1 | 8/2013 | Bass et al. |
| 2013/0330928 A1 | 12/2013 | Ishikawa et al. |
| 2013/0330932 A1 | 12/2013 | Rangarajan et al. |
| 2014/0014745 A1 | 1/2014 | Burrows et al. |
| 2014/0030444 A1 | 1/2014 | Swaminathan et al. |
| 2014/0120688 A1 | 5/2014 | Booth, Jr. et al. |
| 2014/0120727 A1 | 5/2014 | Subramanian et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0187035 A1 | 7/2014 | Posseme et al. |
| 2014/0193580 A1 | 7/2014 | Tiron et al. |
| 2014/0209015 A1 | 7/2014 | Yamada et al. |
| 2014/0213060 A1 | 7/2014 | Kao et al. |
| 2014/0220489 A1 | 8/2014 | Kozuma et al. |
| 2014/0239462 A1 | 8/2014 | Shamma et al. |
| 2014/0268082 A1 | 9/2014 | Michaelson et al. |
| 2014/0272726 A1 | 9/2014 | Chang |
| 2015/0041809 A1 | 2/2015 | Arnold et al. |
| 2015/0056542 A1 | 2/2015 | Meyers et al. |
| 2015/0077733 A1 | 3/2015 | Huang et al. |
| 2015/0079393 A1 | 3/2015 | Freedman et al. |
| 2015/0125679 A1 | 5/2015 | Ishikawa |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0194343 A1 | 7/2015 | Chi et al. |
| 2015/0217330 A1 | 8/2015 | Haukka et al. |
| 2015/0221519 A1 | 8/2015 | Marks et al. |
| 2015/0243520 A1 | 8/2015 | Park et al. |
| 2015/0303064 A1 | 10/2015 | Singer et al. |
| 2015/0332922 A1 | 11/2015 | Chien et al. |
| 2016/0011505 A1 | 1/2016 | Stowers et al. |
| 2016/0011516 A1 | 1/2016 | Devilliers |
| 2016/0035631 A1 | 2/2016 | Lee et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0284559 A1 | 9/2016 | Kikuchi et al. |
| 2016/0293405 A1 | 10/2016 | Matsumoto et al. |
| 2016/0314964 A1 | 10/2016 | Tang et al. |
| 2016/0357107 A1 | 12/2016 | Buchberger, Jr. et al. |
| 2016/0365248 A1 | 12/2016 | Mebarki et al. |
| 2016/0379824 A1 | 12/2016 | Wise et al. |
| 2017/0010535 A1 | 1/2017 | Fujitani et al. |
| 2017/0069462 A1 | 3/2017 | Kanarik et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0178899 A1 | 6/2017 | Kabansky et al. |
| 2017/0184961 A1 | 6/2017 | Nakagawa et al. |
| 2017/0192357 A1 | 7/2017 | Carcasi et al. |
| 2017/0261850 A1 | 9/2017 | Stowers et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0122648 A1 | 5/2018 | Kim et al. |
| 2018/0151350 A1 | 5/2018 | Li |
| 2018/0166278 A1 | 6/2018 | Belyansky et al. |
| 2018/0190503 A1 | 7/2018 | Wise et al. |
| 2018/0224744 A1 | 8/2018 | Bae et al. |
| 2018/0233357 A1 | 8/2018 | Kabansky et al. |
| 2018/0233362 A1 | 8/2018 | Glodde et al. |
| 2018/0307137 A1 | 10/2018 | Meyers et al. |
| 2018/0308687 A1 | 10/2018 | Smith et al. |
| 2018/0312973 A1 | 11/2018 | Agarwal et al. |
| 2018/0314167 A1 | 11/2018 | Chang et al. |
| 2018/0337046 A1 | 11/2018 | Shamma et al. |
| 2018/0350879 A1 | 12/2018 | Sel et al. |
| 2018/0354804 A1 | 12/2018 | Venkatasubramania et al. |
| 2019/0027357 A1 | 1/2019 | Girard et al. |
| 2019/0043731 A1 | 2/2019 | Bristol et al. |
| 2019/0094175 A1 | 3/2019 | Merriman et al. |
| 2019/0094685 A1 | 3/2019 | Marks et al. |
| 2019/0115206 A1 | 4/2019 | Kim et al. |
| 2019/0129307 A1 | 5/2019 | Kwon et al. |
| 2019/0137870 A1 | 5/2019 | Meyers et al. |
| 2019/0153001 A1 | 5/2019 | Cardineau et al. |
| 2019/0157066 A1 | 5/2019 | Zhou et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0214295 A1* | 7/2019 | Yoon ................. H01L 21/76895 |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0341256 A1 | 11/2019 | Shankar et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0391486 A1 | 12/2019 | Jiang et al. |
| 2019/0393035 A1 | 12/2019 | O'Meara et al. |
| 2020/0051781 A1 | 2/2020 | Fujimura et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0096858 A1* | 3/2020 | Lin ......................... G03F 1/22 |
| 2020/0124970 A1 | 4/2020 | Kocsis et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0393765 A1 | 12/2020 | Sakanishi |
| 2021/0013034 A1 | 1/2021 | Wu et al. |
| 2021/0391181 A1 | 12/2021 | Chang et al. |
| 2021/0397085 A1 | 12/2021 | Weidman et al. |
| 2022/0020584 A1 | 1/2022 | Volosskiy et al. |
| 2022/0035247 A1 | 2/2022 | Tan et al. |
| 2022/0043334 A1 | 2/2022 | Tan et al. |

(56) References Cited

U.S. PATENT DOCUMENTS

| | | | |
|---|---|---|---|
| 2022/0075260 A1 | 3/2022 | Marks et al. |
| 2022/0076962 A1 | 3/2022 | Tan et al. |
| 2022/0122846 A1 | 4/2022 | Shamma et al. |
| 2022/0157617 A1 | 5/2022 | Zhou et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2023/0031955 A1 | 2/2023 | Yu et al. |
| 2023/0045336 A1 | 2/2023 | Yu et al. |
| 2023/0107357 A1 | 4/2023 | Dictus et al. |
| 2023/0185196 A1 | 6/2023 | Weidman et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0314946 A1 | 10/2023 | Hansen et al. |

FOREIGN PATENT DOCUMENTS

| | | | |
|---|---|---|---|
| CN | 102610516 A | 7/2012 |
| CN | 102844856 A | 12/2012 |
| CN | 103119695 A | 5/2013 |
| CN | 103243310 A | 8/2013 |
| CN | 104347490 A | 2/2015 |
| CN | 105579906 A | 5/2016 |
| CN | 106876251 A | 6/2017 |
| CN | 108351586 A | 7/2018 |
| CN | 108351594 A | 7/2018 |
| CN | 108388079 A | 8/2018 |
| CN | 109521657 A | 3/2019 |
| CN | 109976097 A | 7/2019 |
| CN | 111258190 A | 6/2020 |
| EP | 1123423 B1 | 8/2007 |
| EP | 2256789 A1 | 12/2010 |
| EP | 2608247 A1 | 6/2013 |
| EP | 3230294 A1 | 10/2017 |
| EP | 3258317 A1 | 12/2017 |
| JP | H07106224 A | 4/1995 |
| JP | H08339950 A | 12/1996 |
| JP | H10209133 A | 8/1998 |
| JP | 2000003844 A | 1/2000 |
| JP | 2000228503 A | 8/2000 |
| JP | 2000331992 A | 11/2000 |
| JP | 2003213001 A | 7/2003 |
| JP | 2003532303 A | 10/2003 |
| JP | 2004006798 A | 1/2004 |
| JP | 2005504146 A | 2/2005 |
| JP | 2006253282 A | 9/2006 |
| JP | 2006290701 A | 10/2006 |
| JP | 2009192350 A | 8/2009 |
| JP | 2010016083 A | 1/2010 |
| JP | 2010016314 A | 1/2010 |
| JP | 2010531931 A | 9/2010 |
| JP | 2010239087 A | 10/2010 |
| JP | 2011520242 A | 7/2011 |
| JP | 2011253185 A | 12/2011 |
| JP | 2011529126 A | 12/2011 |
| JP | 2012142481 A | 7/2012 |
| JP | 2012173315 A | 9/2012 |
| JP | 2012185485 A | 9/2012 |
| JP | 5055743 B2 | 10/2012 |
| JP | 2013096011 A | 5/2013 |
| JP | 2013517600 A | 5/2013 |
| JP | 2013526061 A | 6/2013 |
| JP | 2013145874 A | 7/2013 |
| JP | 5544914 B2 | 7/2014 |
| JP | 2014521111 A | 8/2014 |
| JP | 5705103 B2 | 4/2015 |
| JP | 2015513540 A | 5/2015 |
| JP | 2015201622 A | 11/2015 |
| JP | 2016131238 A | 7/2016 |
| JP | 2016529330 A | 9/2016 |
| JP | 2016208027 A | 12/2016 |
| JP | 2017045869 A | 3/2017 |
| JP | 2017108053 A | 6/2017 |
| JP | 2017116923 A | 6/2017 |
| JP | 2017199909 A | 11/2017 |
| JP | 2018017780 A | 2/2018 |
| JP | 2018518688 A | 7/2018 |
| JP | 2019500490 A | 1/2019 |
| JP | 2019506730 A | 3/2019 |
| JP | 2019053305 A | 4/2019 |
| JP | 2019135755 A | 8/2019 |
| JP | 2019192814 A | 10/2019 |
| JP | 2021523403 A | 9/2021 |
| JP | 2021528676 A | 10/2021 |
| KR | 960000375 B1 | 1/1996 |
| KR | 100679449 B1 | 2/2007 |
| KR | 20070103847 A | 10/2007 |
| KR | 20080018110 A | 2/2008 |
| KR | 100841495 B1 | 6/2008 |
| KR | 20090042059 A | 4/2009 |
| KR | 20130093038 A | 8/2013 |
| KR | 20140016201 A | 2/2014 |
| KR | 20140106442 A | 9/2014 |
| KR | 20170066225 A | 6/2017 |
| KR | 20180054917 A | 5/2018 |
| KR | 20190085654 A | 7/2019 |
| TW | 201133618 A | 10/2011 |
| TW | 201224190 A | 6/2012 |
| TW | I365354 B | 6/2012 |
| TW | 201241555 A | 10/2012 |
| TW | 201415551 A | 4/2014 |
| TW | I494689 B | 8/2015 |
| TW | 201539539 A | 10/2015 |
| TW | 201729006 A | 8/2017 |
| TW | 201734025 A | 10/2017 |
| TW | 201821637 A | 6/2018 |
| TW | 201903191 A | 1/2019 |
| TW | 201907445 A | 2/2019 |
| TW | 202001993 A | 1/2020 |
| TW | 202006168 A | 2/2020 |
| WO | WO-03029015 A2 | 4/2003 |
| WO | WO-2004034445 A2 | 4/2004 |
| WO | WO-2004095551 A1 | 11/2004 |
| WO | WO-2007123539 A1 | 11/2007 |
| WO | WO-2011081151 A1 | 7/2011 |
| WO | WO-2011087984 A2 | 7/2011 |
| WO | WO-2011137059 A2 | 11/2011 |
| WO | WO-2012048094 A3 | 7/2012 |
| WO | WO-2013007442 A1 | 1/2013 |
| WO | WO-2014152023 A1 | 9/2014 |
| WO | WO-2016065120 A1 | 4/2016 |
| WO | WO-2016144960 A1 | 9/2016 |
| WO | WO-2016158864 A1 | 10/2016 |
| WO | WO-2017066319 A2 | 4/2017 |
| WO | WO-2017109040 A1 | 6/2017 |
| WO | WO-2017198418 A1 | 11/2017 |
| WO | WO-2018004551 A1 | 1/2018 |
| WO | WO-2018061670 A1 | 4/2018 |
| WO | WO-2019163455 A1 | 8/2019 |
| WO | WO-2019217749 A1 | 11/2019 |
| WO | WO-2019222320 A1 | 11/2019 |
| WO | WO-2019230462 A1 | 12/2019 |
| WO | WO-2019241402 A1 | 12/2019 |
| WO | WO-2020030855 A2 | 2/2020 |
| WO | WO-2020102085 A1 | 5/2020 |
| WO | WO-2020132281 A1 | 6/2020 |
| WO | WO-2020223011 A1 | 11/2020 |
| WO | WO-2020263750 A1 | 12/2020 |
| WO | WO-2020264557 A1 | 12/2020 |

(56) References Cited

FOREIGN PATENT DOCUMENTS

| WO | WO-2021067632 A2 | 4/2021 |
|---|---|---|
| WO | WO-2021072042 A1 | 4/2021 |

OTHER PUBLICATIONS

Chinese First Office Action dated Aug. 27, 2019 issued in Application No. CN 201611177683.3.
Chinese First Office Action dated May 24, 2017 issued in Application No. CN 201510053668.7.
Chinese Fourth Office Action dated Aug. 20, 2021 issued in Application No. CN 201611177683.3.
Chinese Notice of Allowance dated Jan. 29, 2022 issued in Application No. CN 201611177683.3.
Chinese Second Office Action dated Apr. 17, 2020 issued in Application No. CN 201611177683.3.
Chinese Second Office Action dated Feb. 28, 2018 issued in Application No. CN 201510053668.7.
Chinese Third Office Action dated Oct. 26, 2020 issued in Application No. CN 201611177683.3.
CN Office Action dated Nov. 18, 2022, in Application No. CN201810783756.6 with English translation.
Coons et al., (2010) "Comparison of EUV spectral and ion emission features from laser-produced Sn and Li plasmas," Extreme Ultraviolet (EUV) Lithography, Proc. of SPIE, 7636:763636-1 to 763636-7.
Fan, Y. et al., (2016) "Benchmarking Study of EUV Resists for NXE:3300B," Proc. of Spie, 9776:97760W-1 to 97760W-11 [Downloaded From http://proceedings.spiedigitallibrary.org/ on Mar. 30, 2017].
FUJIFILM Corp., (Presentation) "Negative tone development process for double patterning," 5th International Symposium on Immersion Lithography, Sep. 2008, Presentation Slides No. P-1-P-27.
FUJIFILM Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S. et al., (Jan. 12, 2017) "New Generation Electron Beam Resists: A Review," Chem. Mater., 29:1898-1917.
Gerritsen et al., (Apr. 1, 1986) "Laser-generated plasma as soft x-ray source," J. Appl. Phys., 59(7):2337-2344.
Gordon et al., (2003) "A Kinetic Model for Step Coverage by Atomic Layer Deposition in Narrow Holes or Trenches", Chemical Vapor Deposition, vol. 9, No. 2, pp. 73-78.
International Preliminary Report on Patentability dated Oct. 13, 2022, in PCT Application No. PCT/US2021/025111.
International Search Report and Written Opinion dated Jul. 20, 2021, in PCT Application No. PCT/US2021/025111.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Sep. 9, 2022, in PCT Application No. PCT/US2021/019245.
International Preliminary Report on Patentability dated Sep. 10, 2021 issued in Application No. PCT/US2020/019828 ISA/KR.
International Preliminary Report on Patentability dated Sep. 30, 2021 issued in Application No. PCT/US2020/023146.
International Search Report and Written Opinion dated Aug. 8, 2018 issued in Application No. PCT/US2018/028192.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Jun. 19, 2020 issued in Application No. PCT/US2020/019828 ISA/KR.
International Search Report and Written Opinion dated Oct. 16, 2018 issued in Application No. PCT/US2018/032783.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
JP Office Action dated Jul. 26, 2022 in Application No. JP2021102822 With English translation.
JP Office Action dated Jun. 14, 2022, in Application No. JP20190563508 with English translation.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Notice of Allowance dated Jun. 18, 2020 issued in U.S. Appl. No. 15/952,634.
Petrillo et al., (2013) "Resist process applications to improve EUV patterning," Proc. of SPIE, 8679:867911-1 to 867911-12.
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Taiwanese First Office Action dated Aug. 10, 2020 issued in Application No. TW 105137362.
Taiwanese First Office Action dated Dec. 27, 2019 issued in Application No. TW 105119663.
Taiwanese First Office Action dated Jun. 18, 2020 issued in Application No. TW 105141672.
Taiwanese First Office Action dated May 31, 2018 issued in Application No. TW 104103153.
Taiwanese Second Office Action dated Nov. 18, 2020 issued in Application No. TW 105137362.
Taiwanese Second Office Action dated Nov. 19, 2020 issued in Application No. TW 105141672.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
TW Office Action dated Nov. 22, 2021, in Application No. TW105141672 with English translation.
US Final Office Action, dated Aug. 24, 2017, issued in U.S. Appl. No. 15/189,317.
US Final Office Action, dated Dec. 13, 2017, issued in U.S. Appl. No. 15/061,359.
US Final Office Action, dated Feb. 5, 2019 issued in U.S. Appl. No. 15/495,701.
US Final Office Action, dated Jun. 27, 2019, issued in U.S. Appl. No. 15/952,634.
US Final Office Action, dated Mar. 13, 2017, issued in U.S. Appl. No. 15/061,359.

(56) References Cited

OTHER PUBLICATIONS

US Final Office Action, dated Mar. 30, 2020, issued in U.S. Appl. No. 15/952,634.
US Final Office Action, dated May 11, 2017, issued in U.S. Appl. No. 14/610,038.
US Final Office Action, dated Sep. 10, 2018, issued in U.S. Appl. No. 15/691,659.
US Notice of Allowance, dated Apr. 25, 2018 issued in U.S. Appl. No. 14/948,109.
US Notice of Allowance, dated Aug. 22, 2017, issued in U.S. Appl. No. 14/610,038.
US Notice of Allowance, dated Jul. 28, 2020, issued in U.S. Appl. No. 16/206,959.
US Notice of Allowance, dated Jun. 10, 2020 issued in U.S. Appl. No. 15/979,340.
US Notice of Allowance, dated Jun. 13, 2019, issued in U.S. Appl. No. 15/909,814.
US Notice of Allowance, dated Nov. 9, 2017, issued in U.S. Appl. No. 15/189,317.
US Notice of Allowance dated Sep. 15, 2021, issued in U.S. Appl. No. 16/691,508.
US Notice of Allowance, dated Sep. 19, 2019, issued in U.S. Appl. No. 15/691,659.
US Notice of Allowance, dated Sep. 30, 2021 issued in U.S. Appl. No. 17/008,095.
US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Aug. 9, 2018 issued in U.S. Appl. No. 15/495,701.
US Office Action, dated Dec. 11, 2018, issued in U.S. Appl. No. 15/909,814.
US Office Action, dated Dec. 16, 2019, issued in U.S. Appl. No. 15/952,634.
US Office Action, dated Jan. 23, 2017, issued in U.S. Appl. No. 14/610,038.
US Office Action, dated Jul. 19, 2017, issued in U.S. Appl. No. 15/061,359.
US Office Action, dated Mar. 16, 2017, issued in U.S. Appl. No. 15/189,317.
US Office Action, dated Mar. 18, 2021 issued in U.S. Appl. No. 17/008,095.
US Office Action, dated Mar. 5, 2020, issued in U.S. Appl. No. 16/206,959.
US Office Action, dated Mar. 8, 2019, issued in U.S. Appl. No. 15/952,634.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
US Office Action, dated Nov. 6, 2019 issued in U.S. Appl. No. 15/979,340.
US Office Action, dated Oct. 21, 2016, issued in U.S. Appl. No. 15/061,359.
U.S. Restriction Requirement dated Nov. 14, 2022 in U.S. Appl. No. 17/455,185.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Banerjee, D. et al., "Potential of Metal-Organic Frameworks for Separation of Xenon and Krypton", Accounts of Chemical Research, 2015, vol. 48, No. 2, pp. 211-219.
Cardineau, B. et al., "EUV Resists Based on Tin-oxo Clusters", Advances in Patterning Materials and Processes XXXI, Proceedings of SPIE, Apr. 4, 2014, vol. 9051, pp. 335-346.
CN Office Action dated Dec. 13, 2023 in CN Application No. 201810783756.6 with English translation.
CN Office Action dated Jul. 23, 2024 in CN Application No. 201810783756.6 with English translation.
CN Office Action dated Jun. 1, 2023, in application No. CN201810783756 with English translation.
CN Office Action dated Jun. 8, 2022 in Application No. CN202180002531.2 With English Translation.
CN Office Action dated Jun. 28, 2024 in CN Application No. 202080030905.7 with English translation.
CN Office Action dated Jun. 28, 2024 in CN Application No. 202080032750 with English translation.
CN Office Action dated Mar. 14, 2024 in CN Application No. 201810783756.6, with English Translation.
CN Office Action dated Mar. 31, 2023, in Application No. CN201880046648.9 with English translation.
CN Office Action dated Nov. 16, 2022, in Application No. CN202180002531.2 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
European Search Report dated Feb. 15, 2022, in Application No. EP21741104.
European Office Action dated Feb. 25, 2022 in U.S. Appl. No. 21/741,104.
Extended European Search Report dated Dec. 23, 2021, in Application No. EP19800353.5.
Gross, R.A. et al., "Biodegradable Polymers for the Environment", Science, Aug. 2, 2002, vol. 297, No. 5582, pp. 803-807.
Hamley, I.W., "Nanostructure fabrication using block copolymers", Nanotechnology. Sep. 17, 2003;14(10):R39-R54.
Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Search Report and Written Opinion dated Aug. 4, 2021, in PCT Application No. PCT/US2021/023493.
International Search Report and Written Opinion dated Mar. 4, 2022, in Application No. PCT/US2021/058647.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.

(56) References Cited

OTHER PUBLICATIONS

International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Mar. 23, 2021 issued in Application No. PCT/US2020/053856.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Nov. 11, 2022 in PCT Application No. PCT/US2022/037733.
International Search Report and Written Opinion dated Oct. 8, 2020 in Application No. PCT/US2020/038968.
International Search Report and Written Opinion dated Oct. 13, 2021, in application No. PCT/US2021/037924.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019 [LAMRP617WO].
Joo, W. et al., "Synthesis of Unzipping Polyester and a Study of its Photochemistry", Journal of the American Chemical Society, 2019, vol. 141, No. 37, pp. 14736-14741.
JP Office Action dated Nov. 15, 2022, in Application No. JP2021-176082 with English translation.
JP Office Action dated Mar. 12, 2024 in JP Application No. 2022-202758, with EnglishTranslation.
JP Office Action dated Sep. 5, 2023 in JP Application No. JP2022-202758 with English Translation.
JP Office Action dated Sep. 17, 2024 in JP Application No. 2023-502905 with English translation.
JP Office Action dated Sep. 17, 2024 in JP Application No. 2023-502907, with English Translation.

Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
KR Office Action dated Feb. 8, 2022, in Application No. KR10-2021-7030794 with English Translation.
KR Office Action dated Apr. 23, 2024 in KR Application No. 10-2016-0152489 with English translation.
KR Office Action dated Jul. 10, 2023, in application No. KR 10-2016-0078587 with English Translation.
KR Office Action dated Jul. 10, 2024 in KR Application No. 10-2016-0172666, with English Translation.
KR Office Action dated Jun. 28, 2024 in KR Application No. 10-2021-7033470, with English Translation.
KR Office Action dated May 9, 2022, in Application No. KR1020217030794 with English translation.
KR Office Action dated May 25, 2023, in application No. KR10-2019-7037210 with English translation.
KR Office Action dated Oct. 27, 2023 in KR Application No. 10-2016-0172666, with English Translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Shestaeva, et al., Mechanical, structural, and optical properties of PEALD metallic oxides for optical applications, Applied Optics, vol. 56, No. 4, Feb. 1, 2017). (Year: 2017).
Sundberg, P. et al., "Organic and Inorganic-organic Thin Film Structures by Molecular Layer Deposition: A Review", Beilstein Journal of Nanotechnology, 2014, vol. 5, pp. 1104-1136.
TW Office Action dated Jan. 9, 2023 in Application No. TW20190116155 with English translation.
TW Office Action dated Sep. 5, 2022, in Application No. TW110101388 with English translation.
TW Office Action dated Aug. 9, 2023, in application No. TW109114280 with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 10, 2023 in Application No. TW109108753 with English Translation.
TW Office Action dated Jul. 23, 2024 in TW Application No. 110111878, with English Translation.

(56) References Cited

OTHER PUBLICATIONS

TW Office Action dated Mar. 7, 2022, in Application No. TW110101388 with English translation.
TW Office Action dated Oct. 4, 2024 in TW Application No. 110126430 with English translation.
TW Office Action dated Sep. 12, 2024 in TW Application No. 110107029 with English translation.
TW Office Action dated Sep. 19, 2023, in application No. TW109106198 with English translation.
U.S. Advisory Action dated May 7, 2024 in U.S. Appl. No. 18/298,003.
U.S. Corrected Notice of Allowance dated Jul. 8, 2024 in U.S. Appl. No. 17/594,744.
U.S. Corrected Notice of Allowance dated Jun. 27, 2024 in U.S. Appl. No. 17/593,371.
U.S. Corrected Notice of Allowance dated Sep. 26, 2024 in U.S. Appl. No. 17/593,371.
U.S. Final Office Action dated Feb. 27, 2024 in U.S. Appl. No. 18/298,003.
U.S. Final Office Action dated Mar. 7, 2024 in U.S. Appl. No. 17/310,772.
U.S. Final Office Action dated May 3, 2024 in U.S. Appl. No. 18/297,989.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final office Action dated Feb. 7, 2023 in U.S. Appl. No. 17/455,185.
U.S. Non-Final Office Action dated Jul. 15, 2024 in U.S. Appl. No. 17/645,939.
U.S. Non-Final Office Action dated May 29, 2024 in U.S. Appl. No. 18/298,003.
U.S. Non-Final Office Action dated Nov. 3, 2023, in U.S. Appl. No. 17/594,744.
U.S. Non-Final Office Action dated Nov. 24, 2023 in U.S. Appl. No. 17/593,371.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Sep. 27, 2023, in U.S. Appl. No. 17/310,772.
U.S. Notice of Allowance dated Aug. 12, 2024 in U.S. Appl. No. 17/310,772.
U.S. Notice of Allowance dated Feb. 22, 2022 in U.S. Appl. No. 17/310,635.
U.S. Notice of Allowance dated Jul. 31, 2024 in U.S. Appl. No. 17/310,772.
U.S. Notice of Allowance dated Jun. 20, 2024 in U.S. Appl. No. 17/593,371.
U.S. Notice of Allowance dated Mar. 27, 2024 in U.S. Appl. No. 17/594,744.
U.S. Appl. No. 18/005,571 inventors Hansen et al., filed Jan. 13, 2023.
U.S. Appl. No. 18/005,594, inventors Hansen et al., filed Jan. 13, 2023.
U.S. Appl. No. 18/757,184, inventors Yu J, et al., filed Jun. 27, 2024.
U.S. Restriction requirement dated Aug. 4, 2023, in U.S. Appl. No. 18/297,989.
U.S Restriction requirement dated Aug. 18, 2023 in U.S. Appl. No. 18/298,003.
Xu, et al., "Underlayer designs to enhance the performance of EUV resists," Proceedings of SPIE, vol. 7273, 2009, pp. 727311-1-727311-11.
Xu, P., et al., "Theoretical Study of the Binding of Silane ($SiH_4$) with Borane ($BH_3$), Diborane ($B_2H_6$), and Boron Trichloride ($BCl_3$): The Role of Core-Electron Correlation," Journal of Physical Chemistry A, 2012, vol. 116, pp. 11668-11672.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.

\* cited by examiner

MULTI-LAYER HARDMASK FOR DEFECT REDUCTION IN EUV PATTERNING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

As semiconductor device dimensions continue to shrink, new processing techniques are needed. For example, lithography techniques have evolved over time to produce smaller, higher quality features. Extreme ultraviolet (EUV) lithography is an emerging field that uses a range of extreme ultraviolet wavelengths to pattern a substrate.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, apparatus, and systems for processing semiconductor substrates. In particular, a multi-layer hardmask is described, particularly for use with extreme-ultraviolet photoresist for patterning applications.

In one aspect of the disclosed embodiments, a method of processing a substrate is provided, the method including: (a) receiving a substrate including: (i) underlying material, (ii) an organic planarizing layer positioned over the underlying material, (iii) a multi-layer hardmask positioned over the organic planarizing layer, the multi-layer hardmask including: (1) a lower layer including an inorganic dielectric silicon-containing material, and (2) an upper layer including a metal oxide, a metal nitride, or a metal oxynitride, and (iv) a layer of extreme ultraviolet (EUV) photoresist positioned over the multi-layer hardmask, where the layer of EUV photoresist is patterned to include recessed features, and where portions of the upper layer of the multi-layer hardmask are exposed within the recessed features; (b) etching the exposed portions of the upper layer of the multi-layer hardmask, thereby extending the recessed features into the upper layer of the multi-layer hardmask and exposing portions of the lower layer of the multi-layer hardmask; (c) etching the exposed portions of the lower layer of the multi-layer hardmask, thereby extending the recessed features into the lower layer of the multi-layer hardmask and exposing portions of the organic planarizing layer; (d) etching the exposed portions of the organic planarizing layer, thereby extending the recessed features into the organic planarizing layer and exposing portions of the underlying material; and (e) etching the exposed portions of the underlying material, thereby extending the recessed features into the underlying material.

In some embodiments, the lower layer of the multi-layer hardmask may include a material selected from the group consisting of: amorphous silicon, silicon oxide, silicon carbide, silicon oxycarbide, silicon nitride, silicon oxynitride, and combinations thereof. In these or other embodiments, the lower layer of the multi-layer hardmask may have a thickness of about 10 nm or less. In these or other embodiments, the metal oxide, metal nitride, or metal oxynitride of the upper layer of the multi-layer hardmask may include a metal selected from the group consisting of: titanium, tantalum, hafnium, tin, ruthenium, and combinations thereof. In these or other embodiments, the upper layer of the multi-layer hardmask may have a thickness of about 10 nm or less.

In some cases, the method may include further steps. For example, the method may further include before (b), exposing the substrate to a first plasma to remove excess EUV photoresist within the recessed features. In these or other embodiments, etching the exposed portions of the upper layer of the multi-layer hardmask may include exposing the substrate to a second reactant, the second reactant including a chlorine-containing etchant and/or a bromine-containing reactant. In these or other embodiments, etching exposed portions of the upper layer of the multi-layer hardmask may include exposing the substrate to a second plasma. In these or other embodiments, etching the exposed portions of the lower layer of the multi-layer hardmask may include exposing the substrate to a third reactant, the third reactant including a fluorine-containing reactant and/or a chlorine-containing reactant. In these or other embodiments, etching the exposed portions of the lower layer of the multi-layer hardmask may include exposing the substrate to a third plasma. In these or other embodiments, both the upper layer and the lower layer of the multi-layer hardmask may each have thicknesses of about 10 nm or less.

In certain implementations, the underlying material may include an oxide layer positioned under the organic planarizing layer, a titanium nitride layer or a titanium oxynitride layer positioned under the oxide layer, and a silicon nitride layer positioned under the titanium nitride layer or the titanium oxynitride layer, and etching the exposed portions of the underlying material may extend the recessed feature into the oxide layer and into the titanium nitride layer or titanium oxynitride layer, and the etching in at least (b) and (c) may be driven by an inductively coupled plasma. In these or other embodiments, the method may further include removing the organic planarizing layer after the recessed feature is extended into the oxide layer and the titanium nitride or titanium oxynitride layer.

In some implementations, the underlying material may include a sacrificial hardmask layer positioned under the organic planarizing layer, an ultra-low k dielectric layer positioned below the sacrificial hardmask layer, and a cap layer positioned under the ultra-low k dielectric layer, and etching exposed portions of the underlying material may extend the recessed feature into the sacrificial hardmask layer, the ultra-low k dielectric layer, and the cap layer, and the etching in at least (b) and (c) may be driven by a capacitively coupled plasma. In these or other cases, the sacrificial hardmask layer may include silicon nitride. In these or other cases, the method may further include removing the organic planarizing layer after the recessed feature is extended into the sacrificial hardmask layer, the ultra-low k dielectric layer, and the cap layer.

In another aspect of the disclosed embodiments, a method of processing a substrate is provided, the method including: (a) receiving a substrate having underlying material thereon; (b) depositing a lower layer of a multi-layer hardmask on the underlying material, where the lower layer of the multi-layer hardmask includes an inorganic dielectric silicon-containing material; (c) depositing an upper layer of the multi-layer hardmask on the underlying material, where the upper layer of the multi-layer hardmask includes a metal oxide, a metal nitride, or a metal oxynitride; and (d) depositing extreme ultraviolet photoresist on the upper layer of the multi-layer hardmask.

In some embodiments, each of the lower layer and the upper layer of the multi-layer hardmask have a thickness of about 10 nm or less. In these or other cases, each of the lower layer and the upper layer of the multi-layer hardmask may be deposited through either atomic layer deposition or plasma enhanced atomic layer deposition. In other cases, one or more of these layers may be deposited through chemical vapor deposition or plasma enhanced chemical vapor deposition, or through physical vapor deposition, etc.

In a further aspect of the disclosed embodiments, an apparatus for processing substrates is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor and a memory, where the at least one processor and the memory are communicatively connected with one another, and the memory stores computer-executable instructions for controlling the at least one processor to cause any of the methods described herein.

In another aspect of the disclosed embodiments, an apparatus for processing substrates is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor and a memory, where the at least one processor and the memory are communicatively connected with one another, and the memory stores computer-executable instructions for controlling the at least one processor to cause: (i) receiving the substrate in the reaction chamber, the substrate including: (1) underlying material, (2) an organic planarizing layer positioned over the underlying material, (3) a multi-layer hardmask positioned over the organic planarizing layer, the multi-layer hardmask including: (a) a lower layer including an inorganic dielectric silicon-containing material, and (b) an upper layer including a metal oxide, a metal nitride, or a metal oxynitride, and (4) a layer of extreme ultraviolet (EUV) photoresist positioned over the multi-layer hardmask, where the layer of EUV photoresist is patterned to include recessed features, and where portions of the upper layer of the multi-layer hardmask are exposed within the recessed features; (ii) etching the exposed portions of the upper layer of the multi-layer hardmask, thereby extending the recessed features into the upper layer of the multi-layer hardmask and exposing portions of the lower layer of the multi-layer hardmask; (iii) etching the exposed portions of the lower layer of the multi-layer hardmask, thereby extending the recessed features into the lower layer of the multi-layer hardmask and exposing portions of the organic planarizing layer; (iv) etching the exposed portions of the organic planarizing layer, thereby extending the recessed features into the organic planarizing layer and exposing portions of the underlying material; and (v) etching the exposed portions of the underlying material, thereby extending the recessed features into the underlying material.

In a further aspect of the disclosed embodiments, a system for processing substrates is provided, the system including: (a) a first reaction chamber configured to perform deposition; (b) a second reaction chamber configured to perform etching; and (c) a controller having at least one processor and a memory, where the at least one processor and the memory are communicatively connected with one another, and the memory stores computer-executable instructions for controlling the at least one processor to cause: (i) receiving a substrate in the first reaction chamber, (ii) depositing a lower layer of a multi-layer hardmask on the substrate, where the lower layer of the multi-layer hardmask includes an inorganic dielectric silicon-containing material, (iii) depositing an upper layer of the multi-layer hardmask on the lower layer of the multi-layer hardmask, where the upper layer of the multi-layer hardmask includes a metal oxide, a metal nitride, or a metal oxynitride, (iv) depositing a layer of extreme ultraviolet photoresist above the upper layer of the multi-layer hardmask, (v) patterning the layer of extreme ultraviolet photoresist to define recessed features, thereby exposing portions of the upper layer of the multi-layer hardmask, (vi) transferring the substrate to the second reaction chamber; (vii) etching the exposed portions of the upper layer of the multi-layer hardmask, thereby extending the recessed features into the upper layer of the multi-layer hardmask and exposing portions of the lower layer of the multi-layer hardmask; and (viii) etching the exposed portions of the lower layer of the multi-layer hardmask, thereby extending the recessed features into the lower layer of the multi-layer hardmask and exposing portions of the substrate positioned under the lower layer of the multi-layer hardmask.

In some embodiments, the second reaction chamber may include an inductively coupled plasma generator, and the memory may store computer-executable instructions for controlling the at least one processor to cause generating a first inductively coupled plasma to etch the exposed portions of the upper layer of the multi-layer hardmask in (vii) and to cause generating a second inductively coupled plasma to etch the exposed portions of the lower layer of the multi-layer hardmask in (viii). In some other embodiments, the second reaction chamber may include a capacitively coupled plasma generator, and the memory may store computer-executable instructions for controlling the at least one processor to cause generating a first capacitively coupled plasma to etch the exposed portions of the upper layer of the multi-layer hardmask in (vii) and to cause generating a second capacitively coupled plasma to etch the exposed portions of the lower layer of the multi-layer hardmask in (viii).

These and other aspects are described further below with reference to the drawings.

DETAILED DESCRIPTION

Figure 1:
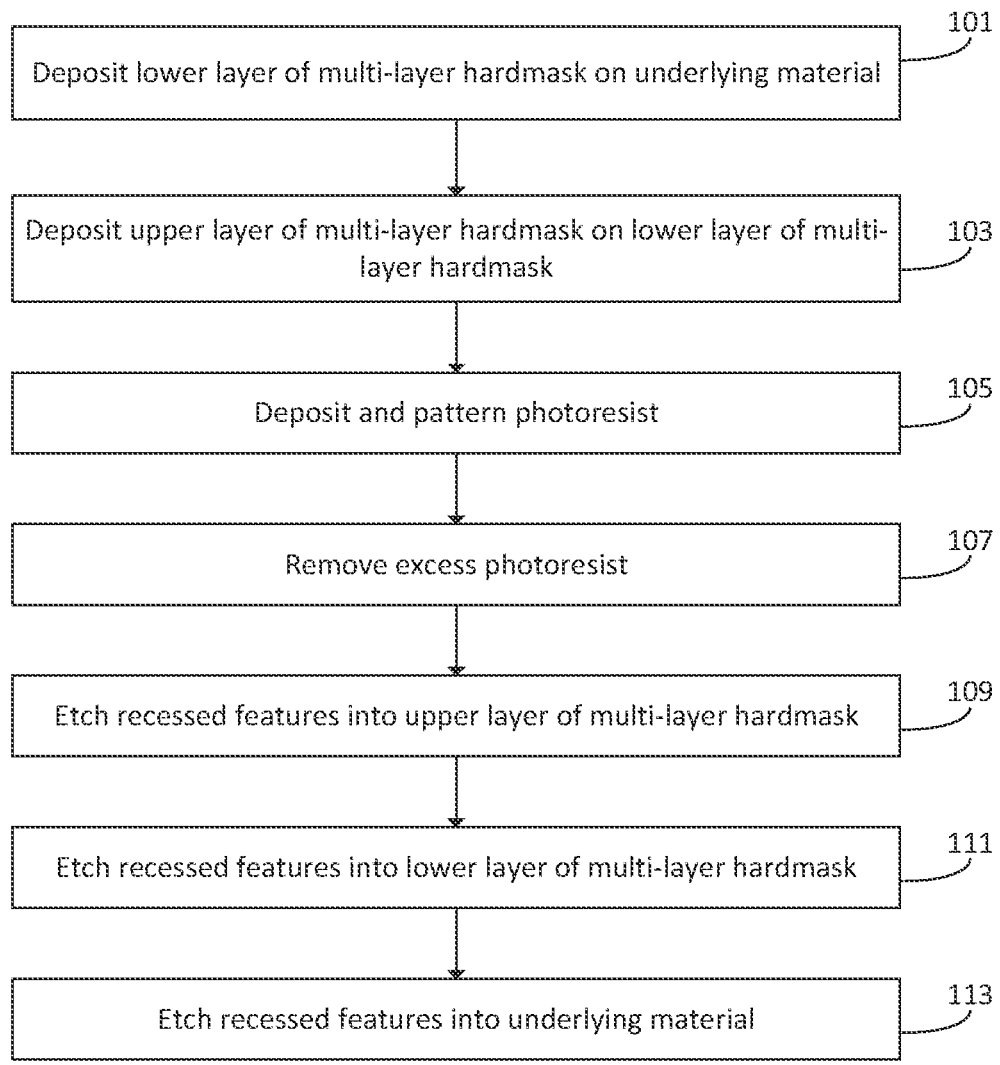
FIG. 1 is a flowchart describing a method of etching recessed features into a substrate using a multi-layer hardmask according to certain embodiments herein.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Extreme ultraviolet (EUV) lithography is gaining popularity in the field of semiconductor processing. However, EUV techniques still face many challenges. For example, when practicing conventional EUV techniques, the thickness of the EUV resist layer is a major limitation with respect to transferring patterns to underlying hardmask films in ti-layer and quad-layer patterning stacks. In particular, resist scumming and local thinning of resist lines can cause undesirable microbridges and line breaks. One context where these issues are likely to occur is patterning features at sub-30 nm pitch. At these dimensions, the resist height is not sufficient for opening the hardmask (e.g., transferring the pattern from the EUV resist to the hardmask) without forming microbridges (e.g., opens) or line breaks due to resist thinning (e.g., shorts). Conventional EUV processing techniques therefore result in a high number of defects and an associated low yield and high processing cost.

In various embodiments herein, a novel hardmask is used in conjunction with EUV patterning to transfer a pattern from an EUV resist layer to the hardmask layer, where it can then be transferred into underlying materials. The hardmask includes multiple layers that together provide improved selectivity between the EUV resist and the hardmask materials, allowing for faithful pattern transfer through the various layers.

It should also be understood that the while the present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range.

The hardmask includes at least an upper layer and a lower layer. The upper layer of the hardmask includes a metal-containing material. Example metal-containing materials include metal oxides, metal nitrides, and metal oxynitrides. The metal in the metal-containing material may include titanium, tantalum, hafnium, tin, zinc, molybdenum, ruthenium, etc., as well as combinations thereof. As such, the upper layer of the hardmask may include, for example, titanium oxide, titanium nitride, titanium oxynitride, tantalum oxide, tantalum nitride, tantalum oxynitride, hafnium oxide, hafnium nitride, hafnium oxynitride, tin oxide, tin nitride, tin oxynitride, ruthenium oxide, ruthenium nitride, ruthenium oxynitride, etc. The metal-containing material of the upper layer of the hardmask provides secondary electron generation during an EUV lithography exposure. This secondary electron generation is beneficial because it reduces the amount of resist scum that forms during exposure, thus improving the degree to which the features are adequately opened. Further, the secondary electron generation during EUV exposure provides a dose-to-size benefit, meaning that the same degree of EUV resist removal can be accomplished at a lower exposure dose due to increased electron generation from the metal-containing material of the upper layer of the hardmask. Another benefit associated with the disclosed hardmask is that the metal-containing material in the upper layer of the hardmask enables adhesion of the EUV resist directly on the upper layer of the hardmask, without the use of an additional organic adhesion layer.

The upper layer of the hardmask may be formed through any available deposition method. In certain embodiments, the upper layer of the hardmask is formed through atomic layer deposition, which may be driven by plasma energy or thermal energy. In other embodiments, the upper layer of the hardmask may be formed through plasma or thermally enhanced chemical vapor deposition, or physical vapor deposition, or spin coating. In various embodiments, the upper layer of the hardmask has a thickness of about 10 nm or less.

The lower layer of the hardmask includes an inorganic dielectric silicon-containing material. Example silicon-containing materials include, but are not limited to, amorphous silicon (e.g., a-Si), silicon oxide, silicon carbide, silicon oxycarbide, silicon nitride, and silicon oxynitride. The lower layer of the hardmask provides excellent selectivity with respect to the underlying layers during pattern transfer. This high degree of selectivity ensures high quality pattern transfer, substantially reducing the amount of shorts that form and increasing yield, as compared to what is achieved with conventional hardmasks.

The lower layer of the hardmask may be formed through any available deposition method. In certain embodiments, the lower layer of the hardmask is formed through atomic layer deposition, which may be driven by plasma energy or thermal energy. In other embodiments, the lower layer of the hardmask may be formed through plasma or thermally enhanced chemical vapor deposition, or physical vapor deposition, or spin coating. In various embodiments, the lower layer of the hardmask has a thickness of about 10 nm or less.

FIG. 1 is a flowchart for a method of patterning a substrate according to various embodiments herein. FIGS. 2A-2H depict a partially fabricated semiconductor substrate as it undergoes the method shown in FIG. 1. The operations of FIG. 1 will be described with reference to the substrate 200 shown in FIGS. 2A-2H.

Figure 2A:
FIGS. 2A-2H depict a partially fabricated semiconductor substrate as it undergoes processing according to the method of FIG. 1.

The method of FIG. 1 begins with the substrate 200 shown in FIG. 2A. The substrate 200 includes underlying material 201. The underlying material 201 may include an organic planarization layer (OPL) at its upper surface. In some cases, the organic planarization layer may include spin-on glass, amorphous carbon, and/or similar materials. The underlying material 201 may also include a series of layers (e.g., one or more layers of oxides, nitrides, ultra-low k dielectric materials, etc.) into which features are to be formed. The composition and layout of this series of layers depends on the application. Further details related to particular implementations are provided below.

Figure 2E:
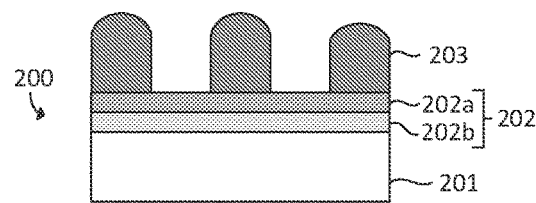
Figure 2B:

At operation 101, a lower layer 202b of a multi-layer hardmask 202 is deposited on the underlying material 201, as shown in FIG. 2B. As mentioned above, the lower layer 202b may be formed through atomic layer deposition or plasma enhanced atomic layer deposition, among other methods. The lower layer 202b includes a metal-containing material as described above. Next, at operation 103, an upper layer 202a of the multi-layer hardmask 202 is deposited on the lower layer 202b of the multi-layer hardmask 202, as shown in FIG. 2C. The upper layer 202a may be formed through atomic layer deposition or plasma enhanced atomic layer deposition, among other methods. The upper layer 202a includes an inorganic dielectric silicon-containing material as described above. At this point, the multi-layer hardmask 202 is fully deposited. Then, at operation 105, a layer of photoresist 203 is deposited and patterned on the upper layer 202a of the multi-layer hardmask 202, as shown in FIG. 2D. The photoresist 203 may be an extreme ultraviolet (EUV) photoresist in various embodiments. In certain embodiments, the photoresist 203 may have a thickness between about 10-50 nm, as deposited. The photoresist 203 may be patterned through lithography techniques.

After the photoresist 203 is patterned, there is typically some excess photoresist (shown at arrow 203a) remaining on the substrate 200. This excess photoresist 203a may be positioned between adjacent protruding features in the patterned photoresist 203, as shown in FIG. 2D. This configuration may be referred to as a microbridging defect (or microbridge), since the excess photoresist 203a forms a small bridge between adjacent protruding features in the photoresist 203. The excess photoresist 203a may be a result of uneven thickness of photoresist 203 deposited across the substrate 200 (e.g., areas where photoresist 203 is thinner may have decreased photoresist 203a after lithographic patterning, which could result in breaks in the line patterns).

In operation 107, the excess photoresist 203a is removed, as shown in FIG. 2E. In various embodiments, the excess photoresist 203a is removed in a descumming operation that involves exposing the substrate 200 to plasma. Advantageously, the upper layer 202a of the multi-layer hardmask 202 is highly resistant to the chemistry/conditions used to remove the excess photoresist 203a. As such, the upper layer 202a of the multi-layer hardmask 202 is not substantially etched while the excess photoresist 203a is being removed. Therefore, the conditions used to remove the excess photoresist 203a can be stronger/harsher than would be acceptable with other hardmasks such as silicon-based hardmasks, which may be damaged under similar processing conditions.

Different types of plasmas may be used for different applications. For instance, in some cases the descumming may be done using an inductively coupled plasma. One example where the inductively coupled plasma may be used is in the context of a hardmask open process. FIGS. 3A-3E, described further below, provide additional details related to such embodiments. In other cases, the descumming may be done using a capacitively coupled plasma. One example where the capacitively coupled plasma may be used is in the context of a back-end-of-line dielectric etch, such as the process used to etch vias. FIGS. 4A-4D, described further below, provide additional details related to such embodiments.

The descum chemistry and plasma conditions are chosen such that they are selective to the upper layer 202a of the multi-layer hardmask 202 (e.g., such that the excess photoresist 203a is removed from between adjacent photoresist features while the upper layer 202a is substantially preserved). In one example where the descum occurs using an inductively coupled plasma, the descum chemistry may include any combination of $Cl_2$, HBr, $CF_4$, and $O_2$, for example. A low bias (e.g., about 100 V or less) may be applied to the substrate. The power used to generate the inductively coupled plasma may be about 500 W or less. The bias and/or plasma power may be pulsed, for example to minimize damage to the photoresist and improve roughness. In another example where the descum occurs using a capacitively coupled plasma, the descum chemistry may include any combination of $CF_4$, $N_2$, $H_2$, $O_2$, $C_xF_y$, etc. A low bias with 60 MHz may be applied to the substrate. The power used to generate the capacitively coupled plasma may be between about 100-300 W. The bias may be pulsed to minimize photoresist damage and improve roughness. Even though the bias and/or plasma generation power may be relatively low, they may be higher than would otherwise be used with conventional mask materials, which may be damaged more easily.

At least because of the relatively strong processing conditions used to remove the excess photoresist 203a, as well as the secondary electron generation from the upper layer 202a during EUV exposure, the multi-layer hardmask 202 substantially reduces the formation of microbridges and similar defects on the substrate. This represents a significant improvement over conventional techniques.

Figure 2F:
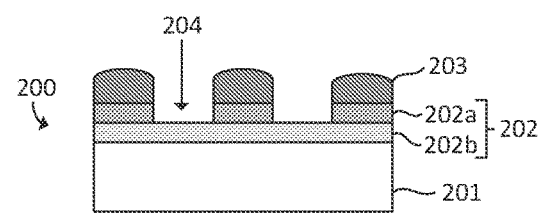
Figure 2C:
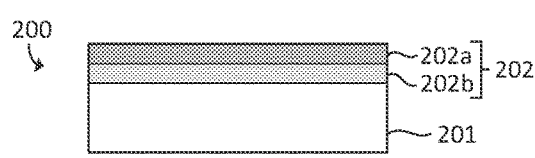

Returning to FIG. 1, the method continues with operation 109, where recessed features 204 are anisotropically etched into the upper layer 202a of the multi-layer hardmask 202, as shown in FIG. 2F. The etching process may be a reactive ion etch. During this etching operation, the photoresist 203 acts as a mask, protecting the upper layer 202a of the multi-layer hardmask 202 in areas where the photoresist 203 is present. As such, the etching is confined to the regions of the recessed features 204, where the photoresist 203 has previously been removed. The etch in operation 109 is highly selective such that the material of the upper layer 202a is removed while the photoresist 203 is substantially preserved. This high degree of selectivity helps prevent line breaks. Some amount of photoresist 203 may be consumed during this etching operation.

In various embodiments, the chemistry used to etch the upper layer 202a may include a chlorine-based chemistry and/or a bromine-based chemistry. Different types of plasmas may be used for different applications. For instance, in some cases the upper layer 202a may be etched using an inductively coupled plasma. One example where the inductively coupled plasma may be used is in the context of a hardmask open process. FIGS. 3A-3E, described further below, provide additional details related to such embodiments. In other cases, the upper layer 202a may be etched using a capacitively coupled plasma. One example where the capacitively coupled plasma may be used is in the context of a back-end-of-line dielectric etch, such as the process used to etch vias. FIGS. 4A-4D, described further below, provide additional details related to such embodiments.

Where an inductively coupled plasma is used to etch the upper layer 202a, any combination of the following gases may be provided to the reaction chamber: HBr, $Cl_2$, $H_2$, $C_xH_y$. Additional reactants or other gases may be provided in some cases. The substrate may be biased at about 300 V or less, and the inductively coupled plasma may be generated at a power of about 300 W or less. The plasma may be pulsed, with a duty cycle of about 30% or less. The pressure in the reaction chamber may be between about 5-20 mTorr (e.g., about 0.66-2.67 Pa). The substrate support may be maintained at a temperature of about 30° C. or less. Where a capacitively coupled plasma is used to etch the upper layer 202a, the chemistry used to etch may include any combination of $C_xH_y$, $H_2$, and $C_xF_y$. Additional reactants or other gases may be provided in some cases. The lower power may be applied at 60 MHz and 27 MHz, for example at a power level between about 100-800 W. The plasma may be pulsed at a duty cycle of about 20-30%. The pressure in the reaction chamber may be between about 20-80 mTorr (e.g., about 2.66-10.7 Pa).

Figure 2G:
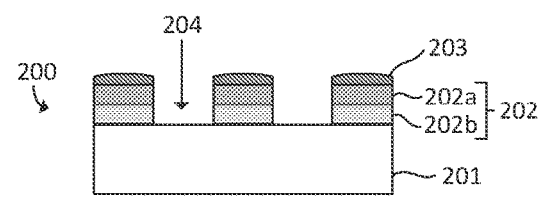
Figure 2D:
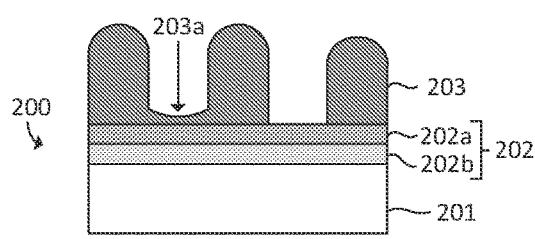

Next, at operation 111, the recessed features 204 are extended by anisotropically etching them into the lower layer 202b of the multi-layer hardmask 202, as shown in FIG. 2G. This etching process may be a reactive ion etching process. During this etching operation, the photoresist 203 and the upper layer 202a of the multi-layer hardmask act as a mask, protecting the lower layer 202b in areas where these materials are present. Therefore, the etching is confined to the regions of the recessed features 204, which are unprotected. The photoresist 203 may be partially consumed while the recessed features 204 are etched into the lower layer 202b of the multi-layer hardmask 202. In other embodiments, the photoresist 203 may be completely consumed during this operation (e.g., in this case, the substrate shown in FIG. 2G would lack photoresist 203). In such embodiments, the upper layer 202a continues to act as a mask, protecting the lower layer 202b in areas where the upper layer 202a is present. The etch in operation 111 is highly selective such that the material of the lower layer 202b is removed while the material of the upper layer 202a is substantially preserved. This high degree of selectivity reduces the likelihood of forming unwanted line breaks.

In various implementations, the chemistry used to etch the lower layer 202b may include a fluorine-based chemistry and/or a chlorine-based chemistry. Generally, the chemistry used to etch the upper layer 202a is different than the chemistry used to etch the lower layer 202b. For instance, the upper layer 202a may be etched with chlorine-based chemistry and the lower layer 202b may be etched with fluorine-based chemistry. In another example, the upper layer 202a may be etched with bromine-based chemistry and the lower layer 202b may be etched with chlorine-based chemistry. In another example, the upper layer 202a may be etched with bromine-based chemistry, and the lower layer 202b may be etched with chlorine-based chemistry. Example chlorine- and bromine-based chemistries are provided above. Example fluorine-based chemistries include, e.g., $C_xF_y$ and $C_xH_yF_z$.

Different types of plasmas may be used for different applications. For instance, in some cases the lower layer 202b may be etched using an inductively coupled plasma. One example where the inductively coupled plasma may be used is in the context of a hardmask open process. As mentioned above, FIGS. 3A-3E provide additional details related to such embodiments. In other cases, the lower layer 202b may be etched using a capacitively coupled plasma. One example where the capacitively coupled plasma may be used is in the context of a back-end-of-line dielectric etch, such as the process used to etch vias. FIGS. 4A-4D provide additional details related to such embodiments.

The chemistry for etching the lower layer 202b is selected such that it is selective to the photoresist 203 and the upper layer 202a (e.g., such that the chemistry targets removal of the lower layer 202b). This selectivity helps prevent line breaks. In embodiments where the lower layer 202b is etched in an inductively coupled plasma, the chemistry used may include any combination of $C_xF_y$, $O_2$, $N_2$, $C_xH_yF_z$, Ar, $SF_6$, and $NF_3$. Additional reactants or other gases may be provided in some cases. The substrate may be biased at about 300 V or less, and the inductively coupled plasma may be generated at a power of about 300 W or less. The plasma may be pulsed at a duty cycle of between about 10-30%. The reaction chamber may be maintained at a pressure of about 5-20 mTorr (e.g., about 0.66-2.67 Pa). The substrate support may be maintained at a temperature of about 10-60° C. In cases where the lower layer 202b is etched in a capacitively coupled plasma, the chemistry used to etch may include any combination of $C_xF_y$, $O_2$, $N_2$, $C_xH_yF_z$, and Ar. Additional reactants may be provided in some cases. The lower power may be provided at 60 MHz and 27 MHz, for example at power levels between about 100-800 W. The plasma may be pulsed with a duty cycle of about 10-30%. The substrate temperature may be maintained between about 0-60° C.

Figure 2H:
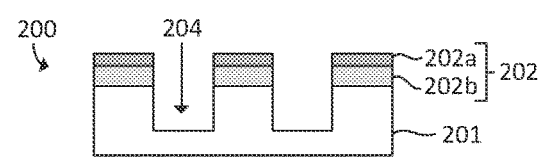

Returning to FIG. 1, the method continues at operation 113, where the recessed features 204 are extended by anisotropically etching them into the underlying material 201, as shown in FIG. 2H. During this etching operation, the upper layer 202a and lower layer 202b of the multi-layer hardmask 202 (as well as any remaining photoresist 203) act as a mask to protect the underlying material 201 in areas where the multi-layer hardmask 202 (or a portion thereof) is present. As such, the etching is confined to the regions of the recessed features 204, which are unprotected. The underlying material 201 may be etched in a number of different steps, depending on the materials and structures that are present on the substrate 200. For example, different layers within the underlying material 201 may be etched in different steps, with each step targeted to remove a particular type of layer.

As the underlying material 201 is etched, any remaining photoresist 203 is consumed. After the photoresist 203 is consumed, the upper layer 202a of the multi-layer hardmask 202 is consumed. Once the upper layer 202a is consumed, the lower layer 202b of the multi-layer hardmask 200 is consumed. The lower layer 202b provides excellent selectivity with respect to the underlying materials 201. In other words, the etching process(es) used to etch the recessed features 204 into the underlying material 201 are highly selective, such that the underlying material 201 is removed while the lower layer 202b is largely preserved. Of course, with sufficient plasma exposure or other processing, the lower layer 202b can be removed, either through consumption as a mask material or through removal in a step designed specifically to remove the lower layer 202b.

In some embodiments, the underlying material 201 includes an organic planarization layer over another structure (e.g., a series of layers), with the organic planarization layer being at the top surface of the underlying material 201. In some such embodiments, the organic planarization layer (which may have a thickness between about 40-100 nm) is completely etched through without fully consuming the upper layer 202a of the multi-layer hardmask 202. In such embodiments, the upper layer 202a may continue to act as a mask while the recessed feature 402 is etched into the series of layers below the organic planarization layer. In other cases, the upper layer 202a of the multi-layer hardmask 202 may be completely consumed while etching through the organic planarization layer. In such cases, the lower layer 202b of the multi-layer hardmask 202 may act as a mask while completing the etch of the organic planarization layer and/or while etching the series of layers under the organic planarization layer.

While FIG. 1 describes many different operations that may be performed, it is understood that in certain embodiments, a number of these operations may be omitted. For example, the method may begin by receiving a substrate as shown in any of FIGS. 2A-2E. In such cases, many of the operations shown in FIG. 1 (particularly those toward the beginning of the method) may be omitted. In one embodiment, the method begins with operation 103 on a substrate as shown in FIG. 2B. In another embodiment, the method begins with operation 105 on a substrate as shown in FIG. 2C. In another embodiment, the method begins with operation 107 on a substrate as shown in FIG. 2D. In another embodiment, the method begins with operation 109 on a substrate as shown in FIG. 2E. Generally, these embodiments all involve etching the substrate while a multi-layer hardmask is present on the substrate. Still other embodiments may include the deposition steps related to forming the multi-layer hardmask, without some or all of the etching steps. For instance, in one embodiment the method involves operations 101 and 103. In another embodiment the method involves operations 101, 103, and 105. These operations may or may not be followed by the other operations shown in FIG. 1.

FIGS. 1 and 2A-2H together describe a technique that may be used in various embodiments. FIGS. 3A-3E illustrate a particular context in which certain embodiments may be practiced. More specifically, FIGS. 3A-3E depict various stages of a hardmask open process in which recessed features are formed in an organic planarization layer, then in an oxide layer, and then in a titanium nitride layer. It is understood that while FIGS. 3A-3E depict particular structures and materials, these represent just one implementation of the disclosed techniques, and that such structures and materials are not intended to be limiting. Generally speaking, the etching operations described in relation to FIGS. 3A-3E may occur in a reaction chamber configured to produce an inductively coupled plasma. In other words, an inductively coupled plasma may be used to drive the etching operations described in FIGS. 3A-3E.

Figure 3A:
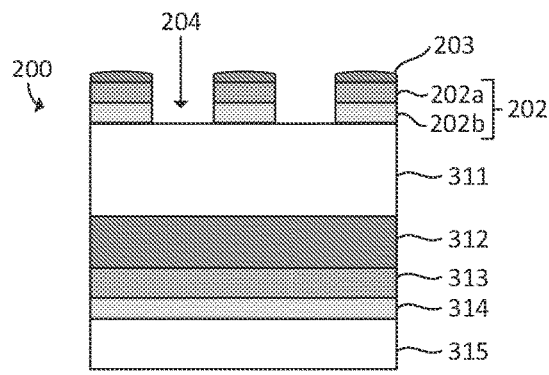
FIGS. 3A-3E show a partially fabricated semiconductor substrate as it undergoes a hardmask open process according to certain embodiments.

FIG. 3A illustrates a substrate 200 having ultra-low k dielectric layer 315, silicon nitride layer 314, titanium nitride layer 313, oxide layer 312, organic planarization layer 311, and multi-layer hardmask 202 having upper layer 202a and lower layer 202b. Example ultra-low k dielectric materials include, e.g., various versions of SiCOH. In some cases, the titanium nitride layer 313 may further include oxygen such that it is a titanium oxynitride layer. The oxide layer 312 may be a TEOS-based oxide layer in certain embodiments (e.g., a silicon oxide layer). The substrate 200 of FIG. 3A may be formed through the process flow described in FIG. 1 (e.g., operations 101-111, or a subset thereof) and FIGS. 2A-2G. For the sake of brevity, the description will not be repeated. The substrate 200 of FIG. 3A is analogous to the substrate 200 of FIG. 2G, with the underlying material 201 of FIG. 2G corresponding to layers 311, 312, 313, 314, and 315 of FIG. 3A.

Figure 3B:
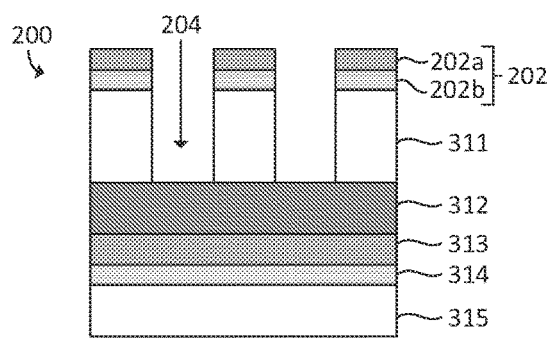

After the recessed features 204 are transferred into both the upper layer 202a and the lower layer 202b of the multi-layer hardmask 202, as shown in FIG. 3A, the recessed features 204 are extended into the organic planarization layer 311, as shown in FIG. 3B. This etching process may be a reactive ion etching process. During this anisotropic etch, any remaining photoresist 203 may act as a mask, thereby protecting materials under the photoresist 203. If and when the photoresist 203 is consumed, the upper layer 202a of the multi-layer hardmask may continue to act as a mask. The etching process for forming the recessed features 204 in the organic planarization layer 311 is selective such that the material of the organic planarization layer 311 is targeted for removal at a higher etching rate, while the remaining photoresist 203 and/or upper layer 202a of the multi-layer hardmask 202 are etched at a lower rate.

In cases where the organic planarization layer is etched using an inductively coupled plasma, the etching chemistry may use any combination of $SO_x$, $CH_4$, $O_2$, $N_2$, $H_2$, and $CO_x$. In cases where the organic planarization layer is etched using a capacitively coupled plasma, the etching chemistry may use any combination of CON, $N_2$, $H_2$, and $O_2$. In either case, additional reactants or other gases may be provided in some implementations. Generally speaking, conventional processing conditions may be used to perform this etching step.

Figure 3C:
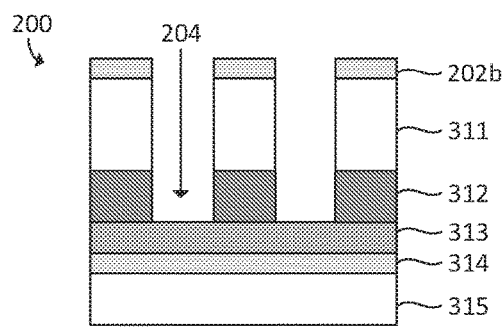

Next, the recessed features 204 are extended into the oxide layer 312, as shown in FIG. 3C. This etching process may be a reactive ion etch. During this anisotropic oxide etch, remaining portions of the upper layer 202a of the multi-layer hardmask 202 act as a mask to ensure that the recessed features 204 are transferred as desired. If and when the upper layer 202a of the multi-layer hardmask 202 is consumed, the lower layer 202b of the multi-layer hardmask 202 continues to act as a mask. This etching process is selective such that the material of the oxide layer 312 is removed at a higher etching rate, while the material of the upper layer 202a and/or lower layer 202b of the multi-layer hardmask 202 are removed at a lower etching rate. In certain embodiments, the chemistry used to etch the recessed features 204 into the oxide layer 312 may include any combination of $C_xF_y$, $C_xH_yF_z$, $N_2$, $O_2$, $H_2$, $C_xH_y$, $SF_6$, $NF_3$, and He. Other reactants or process gases may be provided in some cases. Generally speaking, conventional processing conditions may be used to achieve this step.

Figure 3D:
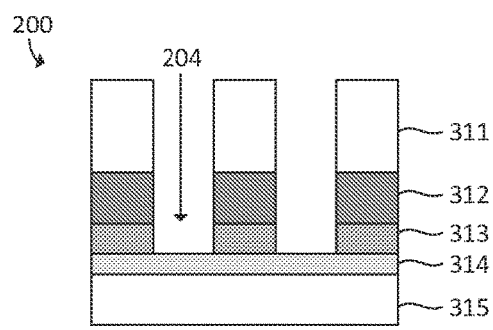

Next, the recessed features 204 are extended into the titanium nitride layer 313, as shown in FIG. 3D. This etching process may be a reactive ion etch. During this anisotropic titanium nitride etch, remaining portions of the lower layer 202b of the multi-layer hardmask 202 act as a mask to ensure that the recessed features 204 are transferred as desired. If and when the lower layer 202b of the multi-layer hardmask 202 is consumed, the organic planarization layer 311 continues to act as a mask. This etching process is selective such that the material of the titanium nitride layer 313 is removed at a higher etching rate, while the material of the lower layer 202b and/or the organic planarization layer 311 are removed at a lower etching rate. In certain implementations, the chemistry used to etch the recessed features 204 into the titanium nitride layer 313 may include any combination of $Cl_2$, HBr, $CH_4$, Ar, $N_2$, He. In some cases, additional reactants or other process gases may be provided. The plasma may be an inductively coupled plasma, as noted above.

Figure 3E:
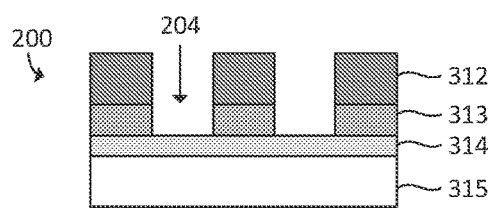

After the recessed features 204 are etched into the titanium nitride layer 313, the organic planarization layer 311 is removed, as shown in FIG. 3E. In some embodiments, the organic planarization layer 311 may be removed by exposing the substrate 200 to an ashing plasma such as an oxygen-containing plasma. Removal of the organic planarization layer 311 is selective such that the material of the organic planarization layer 311 is targeted for removal at a relatively high removal rate, while the oxide layer 312, titanium nitride layer 313, and silicon nitride layer 314 are substantially preserved (and/or etched at a much lower rate relative to the organic planarization layer 311).

The process flow described in FIGS. 2A-2H and 3A-3E illustrate a hardmask open process in which the disclosed multi-layer hardmask may be used to transfer features from a patterned EUV photoresist layer into a stack containing a titanium nitride layer positioned under an oxide layer. In certain embodiments, the various etching operations described in relation to FIG. 3A-3D or 3A-3E may be performed in a single reaction chamber having at least an inductively coupled plasma generator.

FIGS. 4A-4D illustrate another process flow that may be used in combination with the process flow shown in FIGS. 2A-2H. This example is provided in the context of a via etch. In certain embodiments, the etching operations described in relation to FIGS. 4A-4D may be done in a reaction chamber having a capacitively coupled plasma generator. In other words, the etching reactions in FIGS. 4A-4D may be driven by a capacitively coupled plasma.

Figure 4A:
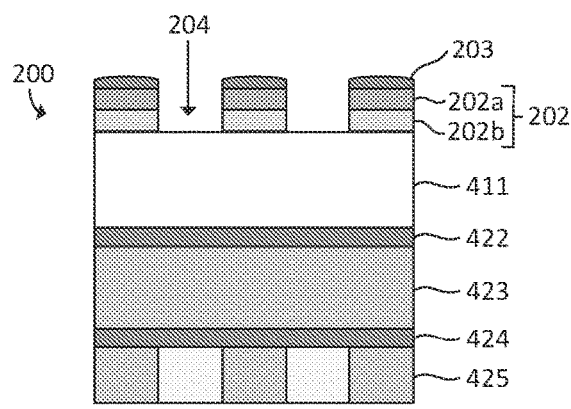
FIGS. 4A-4D show a partially fabricated semiconductor substrate as it undergoes a via etching process according to certain embodiments.

FIG. 4A depicts a substrate 200 having underlying structures 425, cap layer 424, ultra-low k dielectric layer 423, sacrificial hardmask layer 422, organic planarization layer 411, multi-layer hardmask 202 including upper layer 202a and lower layer 202b, and photoresist 203. The cap layer 424 may be referred to as a dielectric cap. Cap layer 424 is often silicon nitride, though the embodiments are not so limited. Example materials for the ultra-low k dielectric layer 423 include various types of SiCOH, and similar materials. One example material for the sacrificial hardmask layer 422 is silicon nitride, though the embodiments are not so limited. The substrate 200 shown in FIG. 4A may be formed through the process described in FIG. 1 (e.g., operations 101-111) and FIGS. 2A-2G. For the sake of brevity, the description will not be repeated. The substrate 200 of FIG. 4A is analogous to the substrate 200 of FIG. 2G, with underlying material 201 of FIG. 2G corresponding to layers 411, 422, 423, 424, and 425 of FIG. 4A.

Figure 4B:
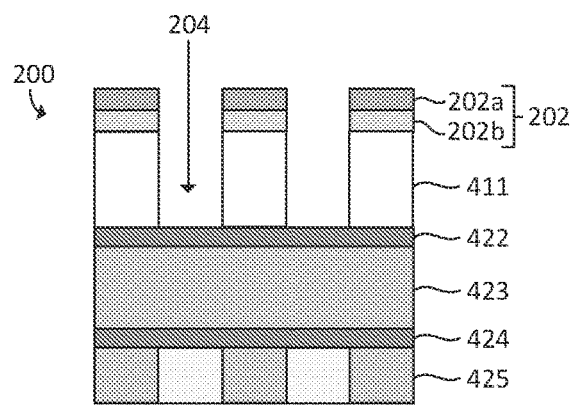

After the recessed features 204 are transferred into both the upper layer 202a and the lower layer 202b of the multi-layer hardmask 202, as shown in FIG. 4A, the recessed features 204 are extended into the organic planarization layer 411, as shown in FIG. 4B. The etching process may be a reactive ion etch. During this anisotropic etching process, any remaining photoresist 203 may act as a mask, thereby protecting materials under the photoresist 203. If and when the photoresist 203 is consumed, the upper layer 202a of the multi-layer hardmask may continue to act as a mask. The etching process for forming the recessed features 204 in the organic planarization layer 411 is selective such that the material of the organic planarization layer 411 is targeted for removal at a higher etching rate, while the remaining photoresist 203 and/or upper layer 202a of the multi-layer hardmask 202 are etched at a lower rate. In some cases, the chemistry for this step may include any combination of $O_2$, $N_2$, $H_2$, and $CO_x$. Other reactants or process gases may be provided in some cases. Generally speaking, conventional processing conditions may be used for this step.

Figure 4C:
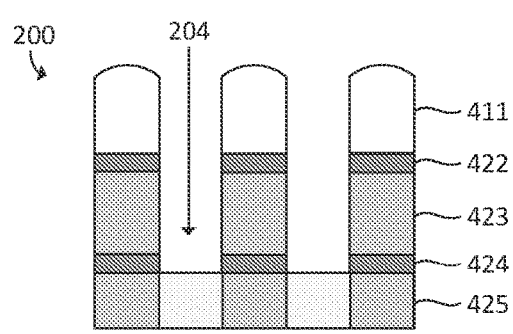

Next, the recessed features 204 are extended into the sacrificial hardmask layer 422, the ultra-low k dielectric layer 423, and the cap layer 424, as shown in FIG. 4C. This may be accomplished in one or more anisotropic etching operations, with each operation targeted to remove one or more of the layers. The etching operations may be reactive ion etching operations. During this etching process, the upper layer 202a and lower layer 202b of the multi-layer hardmask 202, as well as the organic planarization layer 411, act as masks to transfer the pattern through the various layers. For example, while the upper layer 202a is present, it acts to protect underlying materials from etching. If and when the upper layer 202a is consumed, the lower layer 202b continues to act as a mask to protect underlying materials from etching. If and when the lower layer 202b is consumed, the organic planarization layer 411 continues to act as a mask to protect underlying materials from etching. In this way, the pattern of recessed features 204 can be transferred through the various layers to arrive at the substrate 200 shown in FIG. 4C. Generally speaking, traditional chemistries (e.g., $C_xH_yF_z$, $C_xF_y$, $N_2$, $O_2$, $CO_x$, Ar, etc.) may be used along with conventional processing conditions to accomplish these steps.

Figure 4D:
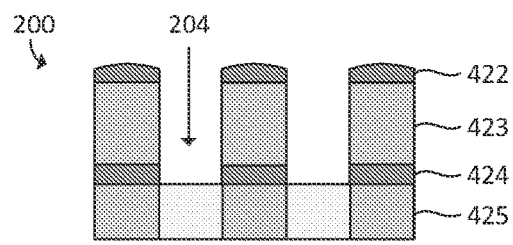

After the recessed features 204 are etched into the cap layer 424, the remaining organic planarization layer 411 may be removed, as shown in FIG. 4D. This removal may be analogous to removal of the organic planarization layer 311 described in relation to FIG. 3E, for example, though different plasma and plasma generation conditions may be used. In certain embodiments, one or more of the layers may be removed using stripping chemistry that includes, e.g., any combination of $O_2$, $CO_x$, $N_2$, and $H_2$. While the figures show removal of the organic planarization layer 411 after the recessed features 204 are extended into the cap layer 424, in some cases this may be done in a different order. For instance, the organic planarization layer 411 may be removed after the recessed features 204 are extended into the ultra-low k dielectric layer 423. In some embodiments, all of the etching operations described in FIGS. 4A-4D may be done in a single reaction chamber.

The process flow described in FIGS. 1, 2A-2H, and 4A-4D may be used in certain embodiments, for example in the context of etching vias or similar features. FIGS. 3A-3E and 4A-4D provide just two examples of applications in which the disclosed multi-layer hardmask may be used. The disclosed multi-layer hardmask may also be used in other applications, as desired.

Apparatus

The techniques described herein may be performed on a variety of apparatuses. One or more reaction chambers may be configured to perform deposition, for example to deposit the upper layer and/or lower layer of the multi-layer hardmask, and/or any other layers/materials described herein. Further, one or more reaction chambers may be configured to perform etching, for example to etch through the upper layer and/or lower layer of the multi-layer hardmask, and/or any other layers/materials described herein. Similarly, one or more reaction chambers may be configured to perform other material removal operations, such as ashing and/or cleaning. These may be dry (e.g., plasma-based) operations or wet (e.g., liquid-based) operations. In certain embodiments, a single reaction chamber may be configured to perform more than one type of task, such as both deposition and etching. In some embodiments, multiple reaction chambers may be combined on a single apparatus, with each reaction chamber configured to perform a particular purpose such as deposition or etching. In some embodiments, multiple apparatuses may be combined in a single system, with each apparatus configured to perform a particular purpose such as deposition or etching. Many configurations are possible.

Figure 5:
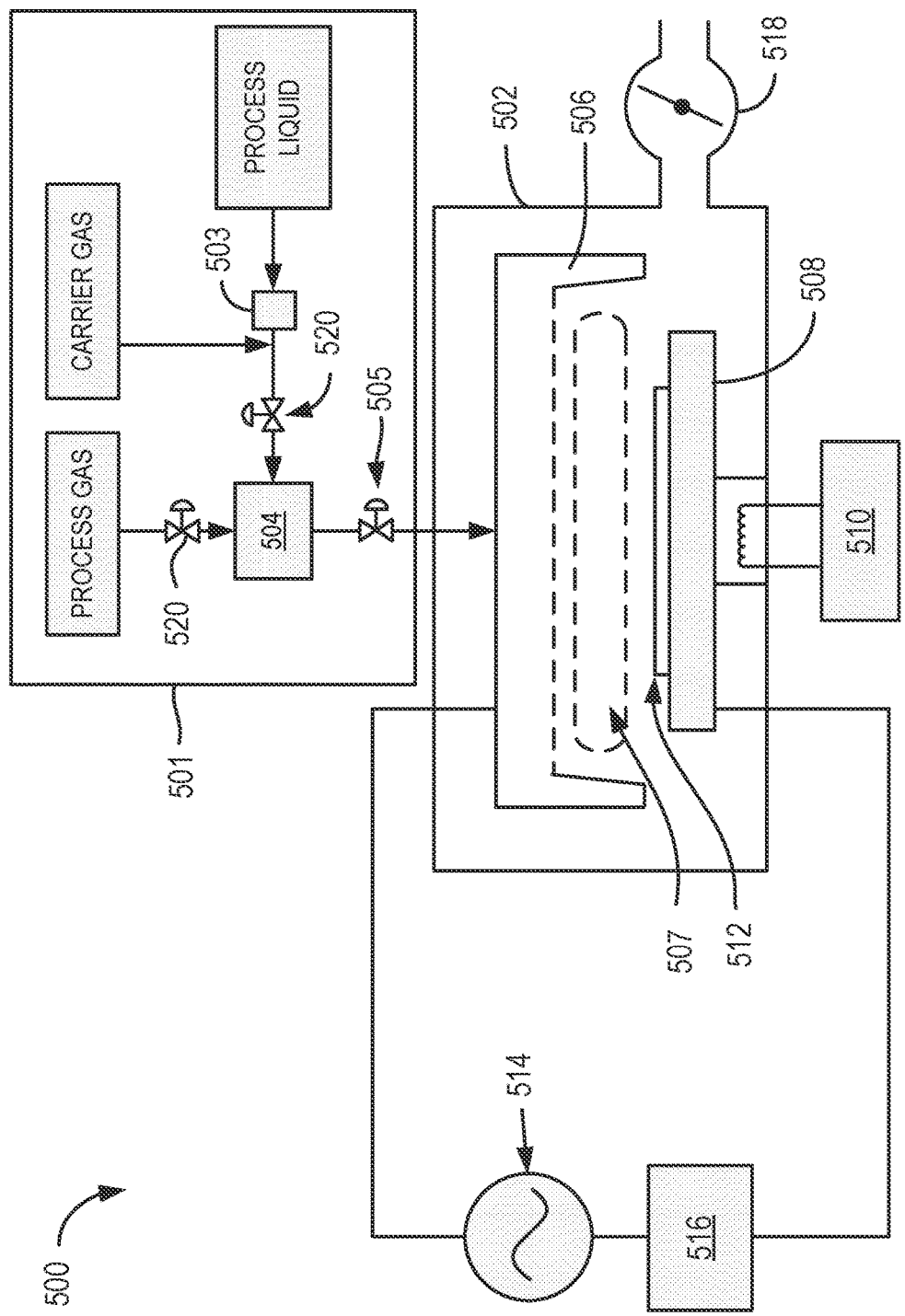
FIG. 5 illustrates a reaction chamber that may be used to deposit various layers described herein.

FIG. 5 schematically shows an embodiment of a process station 500 that may be used to deposit material using atomic layer deposition (ALD) and/or chemical vapor deposition (CVD), either of which may be plasma enhanced. The process station 500 may be used to deposit various layers described herein, including the upper layer and/or lower layer of the multi-layer hardmask. Similarly, the process station 500 may be used to deposit various other layers described in relation to FIGS. 2A-2H, 3A-3E, and 4A-4D. Of course, other deposition chambers may be used as desired for a particular operation or application. For simplicity, the process station 500 is depicted as a standalone process station having a process chamber body 502 for maintaining a low-pressure environment. However, it will be appreciated that a plurality of process stations 500 may be included in a common process tool environment. Further, it will be appreciated that, in some embodiments, one or more hardware parameters of process station 500, including those discussed in detail below, may be adjusted programmatically by one or more computer controllers.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504. Similarly, a showerhead inlet valve 505 may control introduction of process gasses to the showerhead 506.

Some reactants, like BTBAS, may be stored in liquid form prior to vaporization at and subsequent delivery to the process station. For example, the embodiment of FIG. 5 includes a vaporization point 503 for vaporizing liquid reactant to be supplied to mixing vessel 504. In some embodiments, vaporization point 503 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512. In a number of embodiments herein, the showerhead 506 may distribute process gases in a staged manner, for example to enable atomic layer deposition, which relies on cyclic delivery and adsorption of process gases on the substrate surface.

In some embodiments, a microvolume 507 is located beneath showerhead 506. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During a deposition process phase, pedestal 508 may be raised to position substrate 512 within microvolume 507. In some embodiments, microvolume 507 may completely enclose substrate 512 as well as a portion of pedestal 508 to create a region of high flow impedance during a deposition process.

Optionally, pedestal 508 may be lowered and/or raised during portions the deposition process to modulate process pressure, reactant concentration, etc., within microvolume 507. In one scenario where process chamber body 502 remains at a base pressure during the deposition process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment cycles included in the deposition process. At the conclusion of the deposition process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes involve extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 508 may be temperature controlled via heater 510. Further, in some embodiments, pressure control for deposition process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to process station 500.

Figure 6:
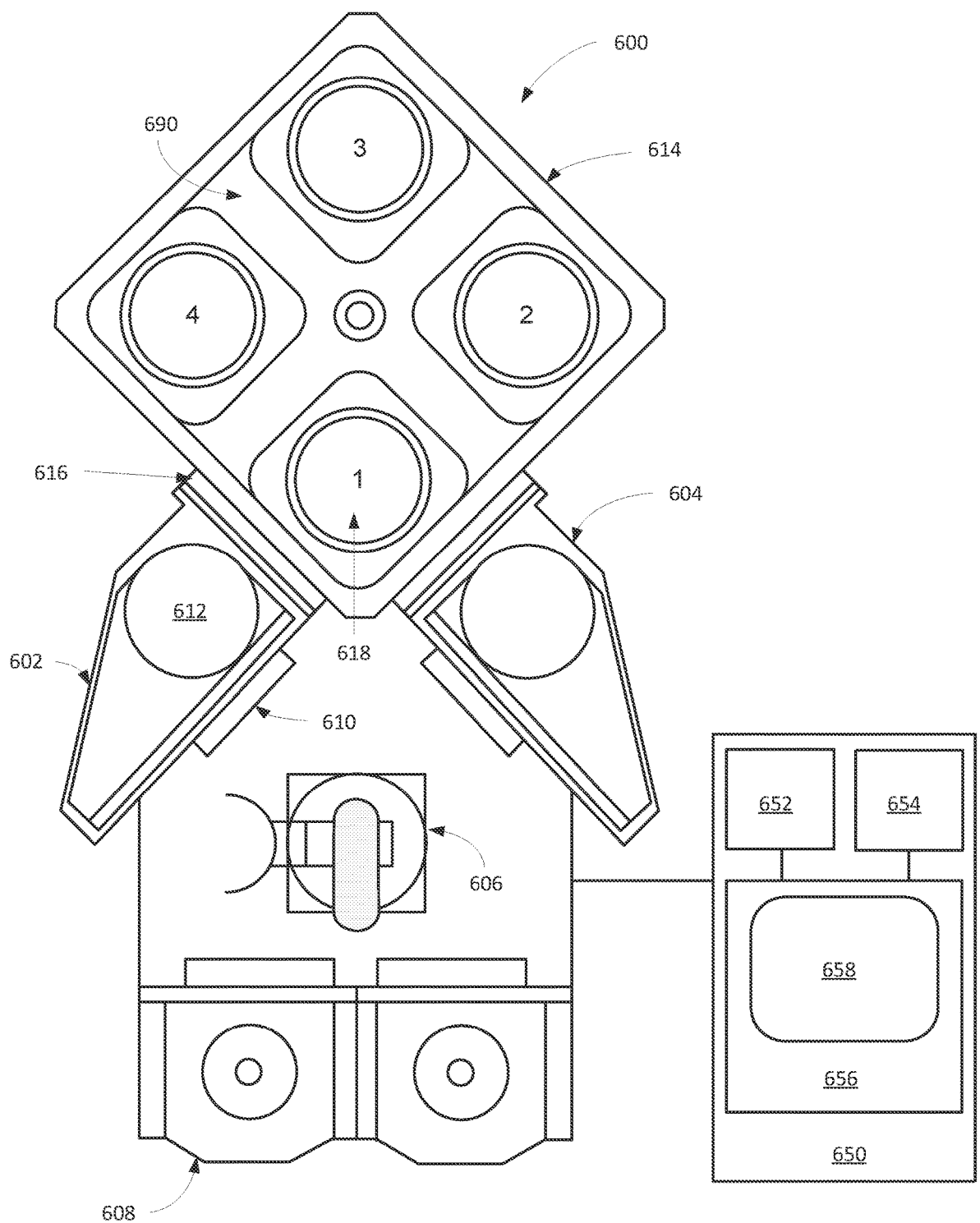
FIG. 6 depicts a multi-station processing tool that may be used to deposit various layers described herein.

FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 comprises a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 comprises four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, one process station may be configured to deposit the lower layer of the multi-layer hardmask, and another process station may be configured to deposit the upper layer of the multi-layer hardmask. Each process station may be as described above in relation to FIG. 5. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. System control software 658 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 600. System control software 658 may be configured in any suitable way. For example, various process tool component subroutines or control objects may be written to control operation of the process tool components to carry out various process tool processes in accordance with the disclosed methods. System control software 658 may be coded in any suitable computer readable programming language.

In some embodiments, system control software 658 may include input/output control (IOC) sequencing instructions for controlling the various parameters described above. For example, each phase of a PEALD process may include one or more instructions for execution by system controller 650. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 7A:
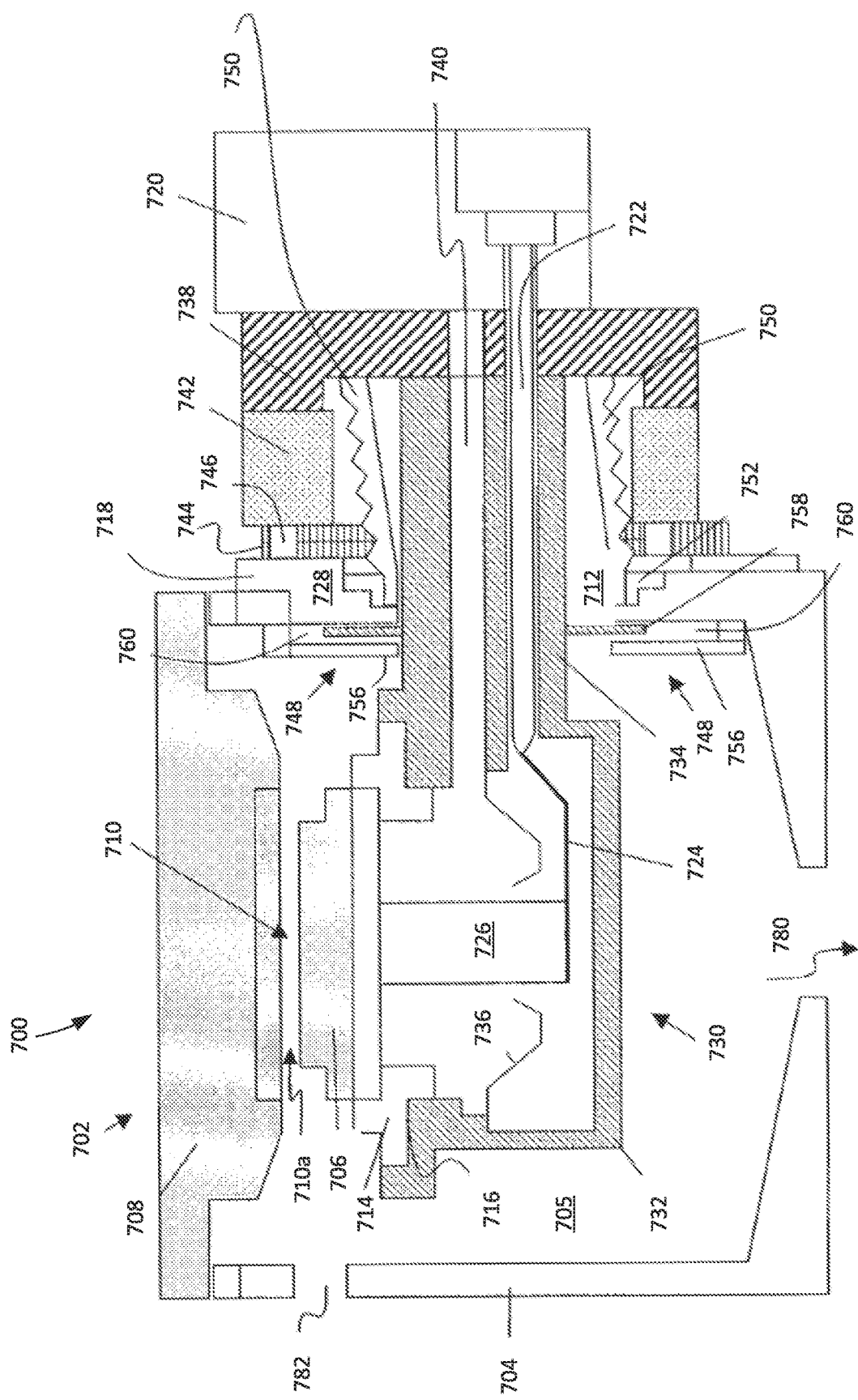
FIGS. 7A-7C show a reaction chamber that may be used to etch various layers described herein.
Figure 7B:
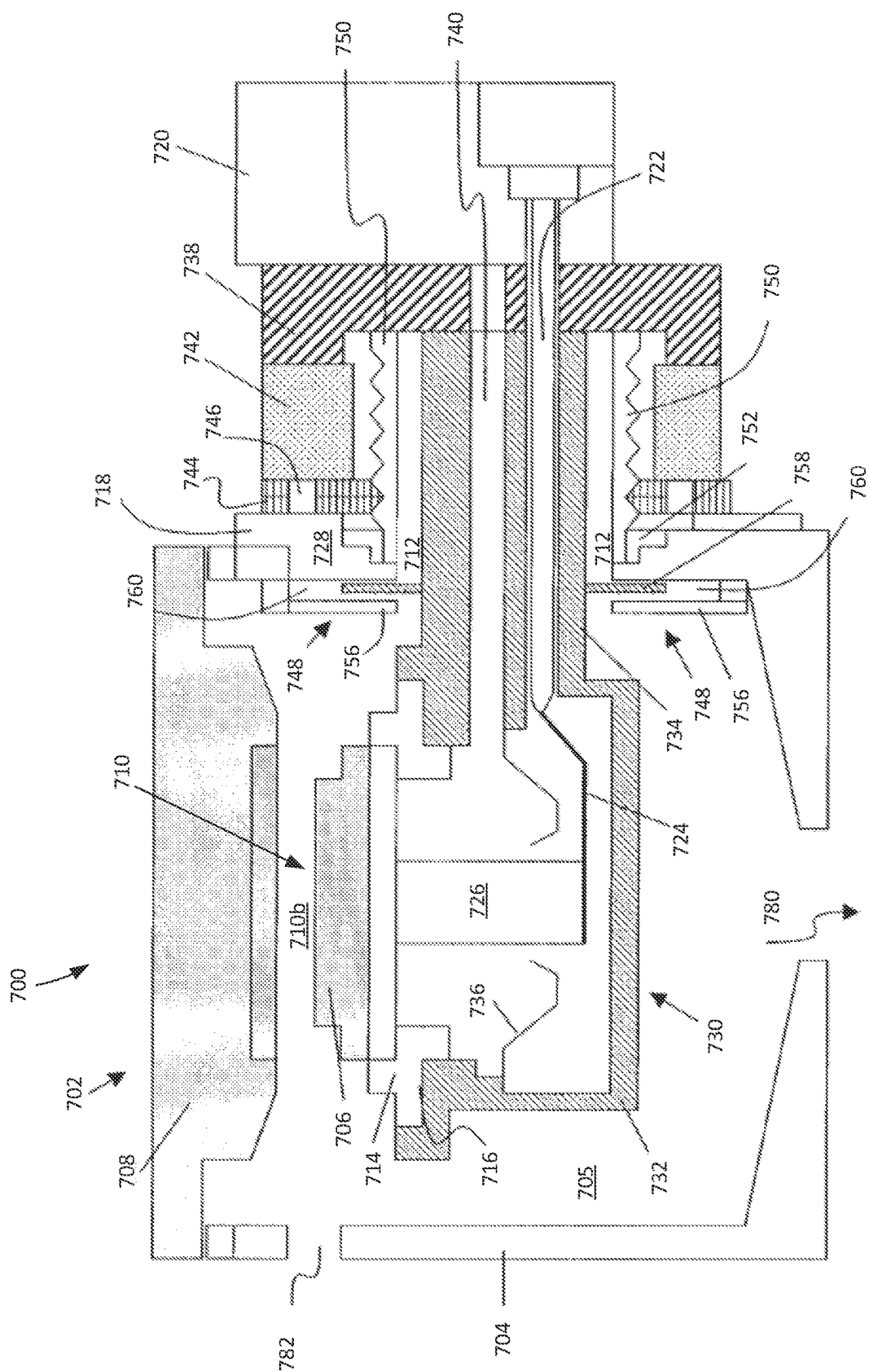
Figure 7C:
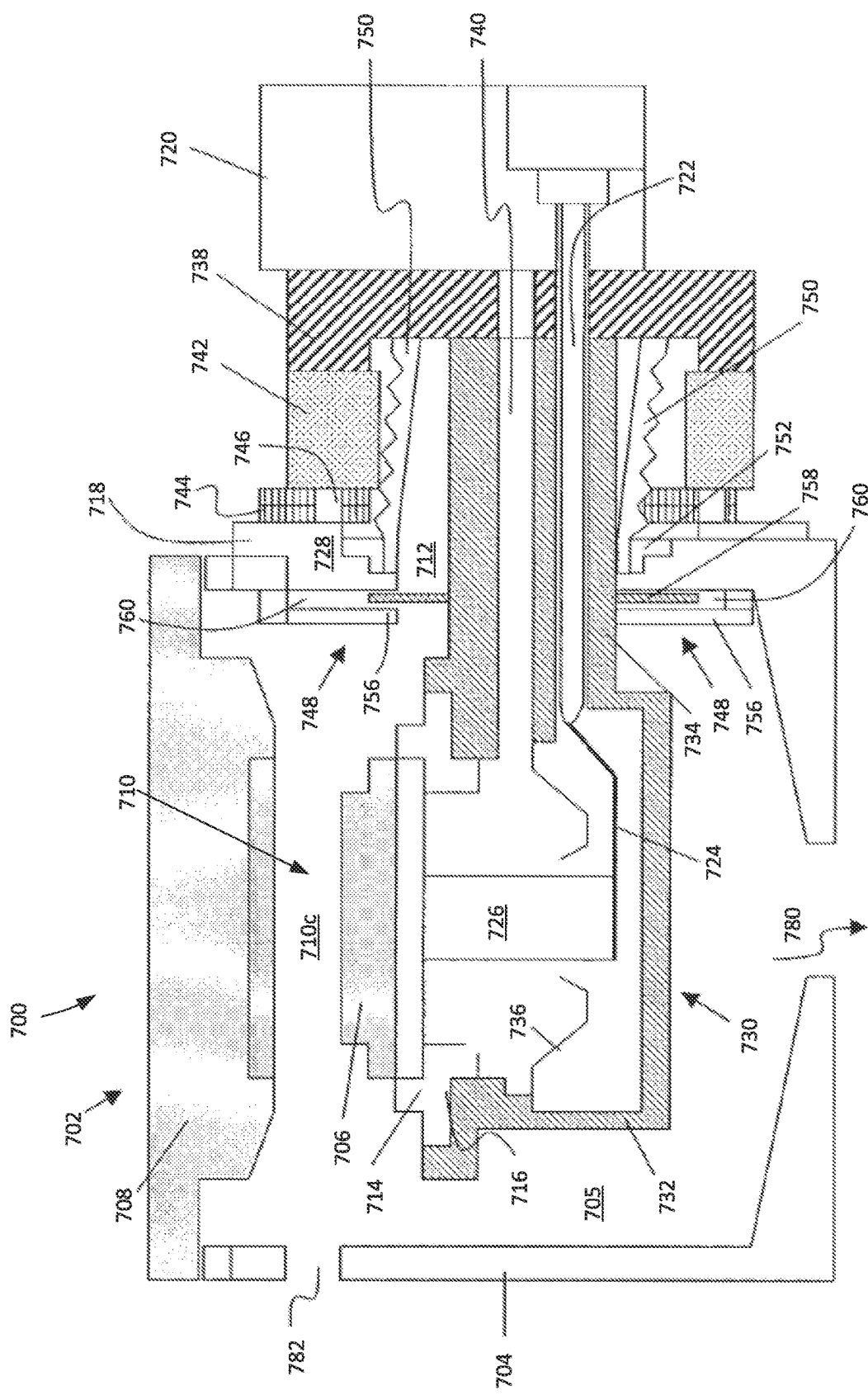

FIGS. 7A-7C illustrate an embodiment of an adjustable gap capacitively coupled confined RF plasma reactor 700 that may be used for performing the etching operations described herein. For example, such a reactor may be used to etch through any one or more of the layers described herein, including but not limited to the upper layer and lower layer of the multi-layer hardmask, as well as the organic planarization layer and the other layers described in relation to FIGS. 2A-2H and 4A-4D. Other types of etching reactors, which may have different or additional types of plasma generators, may be used as desired for a particular application. As depicted, a vacuum chamber 702 includes a chamber housing 704, surrounding an interior space housing a lower electrode 706. In an upper portion of the chamber 702 an upper electrode 708 is vertically spaced apart from the lower electrode 706. Planar surfaces of the upper and lower electrodes 708, 706 are substantially parallel and orthoganol to the vertical direction between the electrodes. Preferably the upper and lower electrodes 708, 706 are circular and coaxial with respect to a vertical axis. A lower surface of the upper electrode 708 faces an upper surface of the lower electrode 706. The spaced apart facing electrode surfaces define an adjustable gap 710 therebetween. During operation, the lower electrode 706 is supplied RF power by an RF power supply (match) 720. RF power is supplied to the lower electrode 706 though an RF supply conduit 722, an RF strap 724 and an RF power member 726. A grounding shield 736 may surround the RF power member 726 to provide a more uniform RF field to the lower electrode 706. A wafer is inserted through wafer port 782 and supported in the gap 710 on the lower electrode 706 for processing, and a process gas is supplied to the gap 710 and excited into plasma state by the RF power. The upper electrode 708 can be powered or grounded.

In the embodiment shown in FIGS. 7A-7C, the lower electrode 706 is supported on a lower electrode support plate 716. An insulator ring 714 interposed between the lower electrode 706 and the lower electrode Support plate 716 insulates the lower electrode 706 from the support plate 716.

An RF bias housing 730 supports the lower electrode 706 on an RF bias housing bowl 732. The bowl 732 is connected through an opening in a chamber wall plate 718 to a conduit support plate 738 by an arm 734 of the RF bias housing 730. In a preferred embodiment, the RF bias housing bowl 732 and RF bias housing arm 734 are integrally formed as one component, however, the arm 734 and bowl 732 can also be two separate components bolted or joined together.

The RF bias housing arm 734 includes one or more hollow passages for passing RF power and facilities, such as gas coolant, liquid coolant, RF energy, cables for lift pin control, electrical monitoring and actuating signals from outside the vacuum chamber 702 to inside the vacuum chamber 702 at a space on the backside of the lower electrode 706. The RF supply conduit 722 is insulated from the RF bias housing arm 734, the RF bias housing arm 734 providing a return path for RF power to the RF power supply 720. A facilities conduit 740 provides a passageway for facility components. Further details of the facility components are not shown here for simplicity of description. The gap 710 is preferably surrounded by a confinement ring assembly or shroud (not shown). The interior of the vacuum chamber 702 is maintained at a low pressure by connection to a vacuum pump through vacuum portal 780.

The conduit support plate 738 is attached to an actuation mechanism 742. The actuation mechanism 742, such as a servo mechanical motor, stepper motor or the like is attached to a vertical linear bearing 744, for example, by a screw gear 746 such as a ball screw and motor for rotating the ball screw. During operation to adjust the size of the gap 710, the actuation mechanism 742 travels along the vertical linear bearing 744. FIG. 7A illustrates the arrangement when the actuation mechanism 742 is at a high position on the linear bearing 744 resulting in a small gap 710 a. FIG. 7B illustrates the arrangement when the actuation mechanism 742 is at a mid position on the linear bearing 744. As shown, the lower electrode 706, the RF bias housing 730, the conduit support plate 738, the RF power supply 720 have all moved lower with respect to the chamber housing 704 and the upper electrode 708, resulting in a medium size gap 710 b.

FIG. 7C illustrates a large gap 710 c when the actuation mechanism 742 is at a low position on the linear bearing. Preferably, the upper and lower electrodes 708, 706 remain co-axial during the gap adjustment and the facing surfaces of the upper and lower electrodes across the gap remain parallel.

This embodiment allows the gap 710 between the lower and upper electrodes 706, 708 in the CCP chamber 702 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion to provide the adjustable gap between lower and upper electrodes 706, 708.

FIG. 7A illustrates laterally deflected bellows 750 sealed at a proximate end to the conduit support plate 738 and at a distal end to a stepped flange 728 of chamber wall plate 718. The inner diameter of the stepped flange defines an opening 712 in the chamber wall plate 718 through which the RF bias housing arm 734 passes. The distal end of the bellows 750 is clamped by a clamp ring 752.

The laterally deflected bellows 750 provides a vacuum seal while allowing vertical movement of the RF bias housing 730, conduit support plate 738 and actuation mechanism 742. The RF bias housing 730, conduit support plate 738 and actuation mechanism 742 can be referred to as a cantilever assembly. Preferably, the RF power supply 720 moves with the cantilever assembly and can be attached to the conduit support plate 738. FIG. 7B shows the bellows 750 in a neutral position when the cantilever assembly is at a mid position. FIG. 7C shows the bellows 750 laterally deflected when the cantilever assembly is at a low position.

A labyrinth seal 748 provides a particle barrier between the bellows 750 and the interior of the plasma processing chamber housing 704. A fixed shield 756 is immovably attached to the inside inner wall of the chamber housing 704 at the chamber wall plate 718 so as to provide a labyrinth groove 760 (slot) in which a movable shield plate 758 moves vertically to accommodate vertical movement of the cantilever assembly. The outer portion of the movable shield plate 758 remains in the slot at all vertical positions of the lower electrode 706.

In the embodiment shown, the labyrinth seal 748 includes a fixed shield 756 attached to an inner surface of the chamber wall plate 718 at a periphery of the opening 712 in the chamber wall plate 718 defining a labyrinth groove 760. The movable shield plate 758 is attached and extends radially from the RF bias housing arm 734 where the arm 734 passes through the opening 712 in the chamber wall plate 718. The movable shield plate 758 extends into the labyrinth groove 760 while spaced apart from the fixed shield 756 by a first gap and spaced apart from the interior surface of the chamber wall plate 718 by a second gap allowing the cantilevered assembly to move vertically. The labyrinth seal 748 blocks migration of particles spalled from the bellows 750 from entering the vacuum chamber interior 705 and blocks radicals from process gas plasma from migrating to the bellows 750 where the radicals can form deposits which are subsequently spalled.

FIG. 7A shows the movable shield plate 758 at a higher position in the labyrinth groove 760 above the RF bias housing arm 734 when the cantilevered assembly is in a high position (small gap 710 a). FIG. 7C shows the movable shield plate 758 at a lower position in the labyrinth groove 760 above the RF bias housing arm 734 when the cantilevered assembly is in a low position (large gap 710 c). FIG. 7B shows the movable shield plate 758 in a neutral or mid position within the labyrinth groove 760 when the cantilevered assembly is in a mid position (medium gap 710 b). While the labyrinth seal 748 is shown as symmetrical about the RF bias housing arm 734, in other embodiments the labyrinth seal 748 may be asymmetrical about the RF bias arm 734.

In certain embodiments, a different kind of etching reactor may be used, for example one that has an alternative or additional plasma generator for forming a different type of plasma. In some cases, an inductively coupled plasma may be used. The substrate may be directly exposed to the plasma, or the plasma may be generated remotely from the substrate. Example etching apparatus that may be used in some cases include products from the Flex® product family, the Kiyo® product family, and the Versys® product family, each available from Lam Research Corporation of Fremont, CA.

Figure 8:
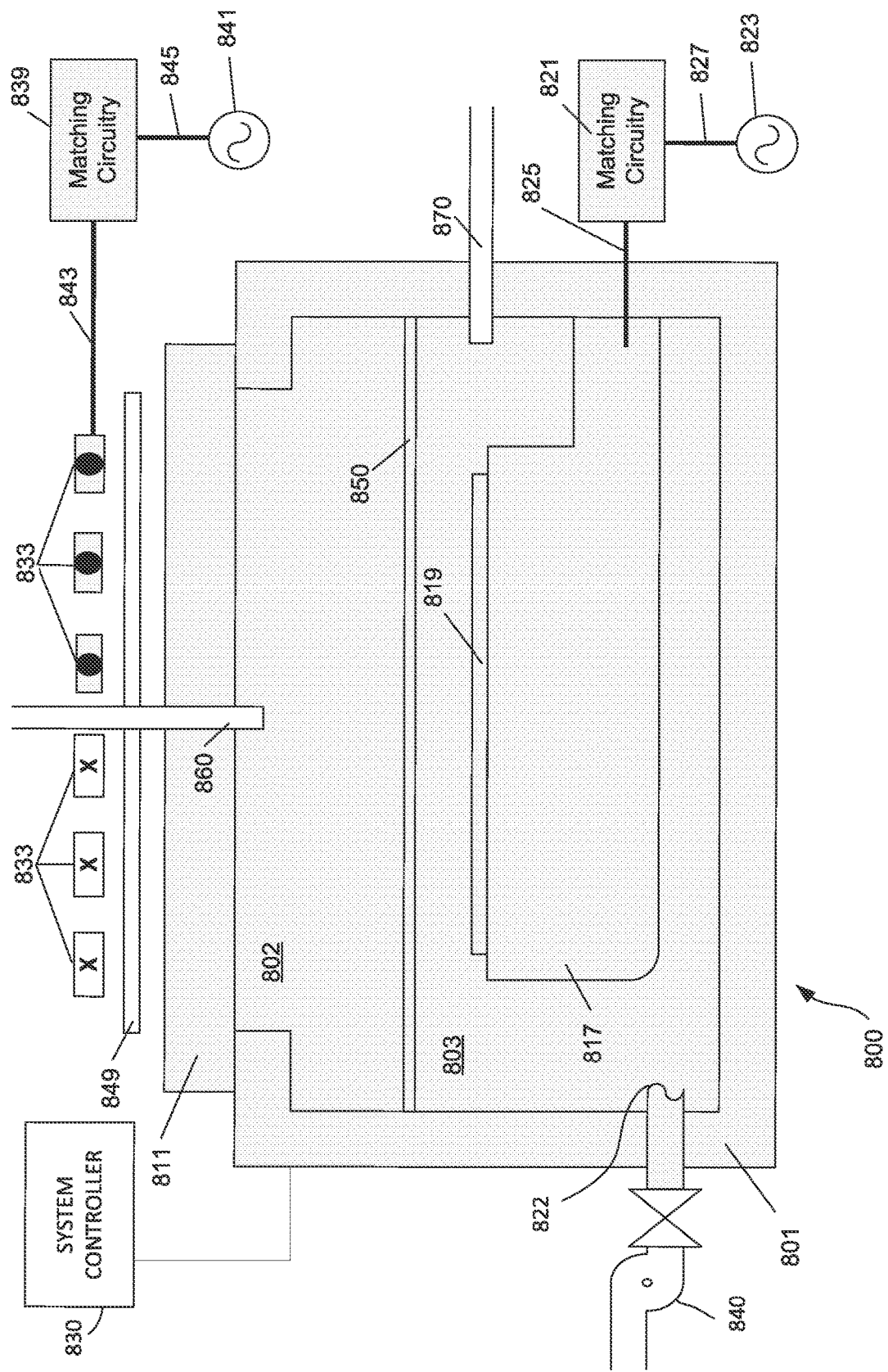
FIG. 8 shows an alternative reaction chamber that may be used to etch various layers described herein.

FIG. 8 schematically shows a cross-sectional view of an inductively coupled plasma etching apparatus 800 in accordance with certain embodiments herein. For example, such an apparatus may be used to etch through any one or more of the layers described herein, including but not limited to the upper layer and lower layer of the multi-layer hardmask, as well as the organic planarization layer and the other layers described in relation to FIGS. 2A-2H and 3A-3E. Other types of etching reactors, which may have different or additional types of plasma generators, may be used as desired for a particular application, as mentioned above. The inductively coupled plasma etching apparatus 800 includes an overall etching chamber structurally defined by chamber walls 801 and a window 811. The chamber walls 801 may be fabricated from stainless steel or aluminum. The window 811 may be fabricated from quartz or other dielectric material. An optional internal plasma grid 850 divides the overall etching chamber into an upper sub-chamber 802 and a lower sub-chamber 803. The plasma grid 850 may include a single grid or multiple individual grids. In many embodiments, plasma grid 850 may be removed, thereby utilizing a chamber space made of sub-chambers 802 and 803.

A chuck 817 is positioned within the lower sub-chamber 803 near the bottom inner surface. The chuck 817 is configured to receive and hold a semiconductor wafer 819 upon which the etching process is performed. The chuck 817 can be an electrostatic chuck for supporting the wafer 819 when present. In some embodiments, an edge ring (not shown) surrounds chuck 817, and has an upper surface that is approximately planar with a top surface of a wafer 819, when present over chuck 817. The chuck 817 also includes electrostatic electrodes for chucking and dechucking the wafer. A filter and DC clamp power supply (not shown) may be provided for this purpose. Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817.

A coil 833 is positioned above window 811. The coil 833 is fabricated from an electrically conductive material and includes at least one complete turn. The exemplary coil 833 shown in FIG. 8 includes three turns. The cross-sections of coil 833 are shown with symbols, and coils having an "X" extend rotationally into the page, while coils having a "•" extend rotationally out of the page. An RF power supply 841 is configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849 is positioned between the coil 833 and the window 811. The Faraday shield 849 is maintained in a spaced apart relationship relative to the coil 833. The Faraday shield 849 is disposed immediately above the window 811. The coil 833, the Faraday shield 849, and the window 811 are each configured to be substantially parallel to one another. The Faraday shield may prevent metal or other species from depositing on the dielectric window of the plasma chamber.

Process gases may be supplied through a main injection port 860 positioned in the upper chamber and/or through a side injection port 870, sometimes referred to as an STG. A vacuum pump, e.g., a one or two stage mechanical dry pump and/or turbomolecular pump 840, may be used to draw process gases out of the process chamber and to maintain a pressure within the process chamber 800 by using a closed-loop-controlled flow restriction device, such as a throttle valve (not shown) or a pendulum valve (not shown), during operational plasma processing.

During operation of the apparatus, one or more reactant gases may be supplied through injection ports 860 and/or 870. In certain embodiments, gas may be supplied only through the main injection port 860, or only through the side injection port 870. In some cases, the injection ports may be replaced by showerheads. The Faraday shield 849 and/or optional grid 850 may include internal channels and holes that allow delivery of process gases to the chamber. Either or both of Faraday shield 849 and optional grid 850 may serve as a showerhead for delivery of process gases.

Radio frequency power is supplied from the RF power supply 841 to the coil 833 to cause an RF current to flow through the coil 833. The RF current flowing through the coil 833 generates an electromagnetic field about the coil 833. The electromagnetic field generates an inductive current within the upper sub-chamber 802. The physical and chemical interactions of various generated ions and radicals with the wafer 819 selectively etch features of the wafer.

If the plasma grid 850 is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850, if present, may act to limit the number of hot electrons in the lower sub-chamber 803. In some embodiments, the apparatus is designed and operated such that the plasma present in the lower sub-chamber 803 is an ion-ion plasma. In other embodiments, the apparatus may be designed and operated such that the plasma present in the lower sub-chamber 803 is an electron-ion plasma.

Volatile etching byproducts may be removed from the lower-sub chamber 803 through port 822. The chuck 817 disclosed herein may operate at elevated temperatures ranging between about 30° C. and about 250° C. In some cases, the chuck 817 may also operate at lower temperatures, for example when the chuck 817 is actively chilled. In such cases the chuck 817 may operate at substantially lower temperatures, as desired. The temperature will depend on the etching process operation and specific recipe. In some embodiments, the chamber 801 may operate at pressures in the range of between about 1 mTorr and about 95 mTorr. In certain embodiments, the pressure may be higher.

Chamber 801 may be coupled to facilities (not shown) when installed in a clean room or a fabrication facility. Facilities include plumbing that provide processing gases, vacuum, temperature control, and environmental particle control. These facilities are coupled to chamber 801, when installed in the target fabrication facility. Additionally, chamber 801 may be coupled to a transfer chamber that allows robotics to transfer semiconductor wafers into and out of chamber 801 using typical automation.

In some embodiments, a system controller 830 (which may include one or more physical or logical controllers) controls some or all of the operations of an etching chamber. The system controller 830 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 830 or they may be provided over a network. In certain embodiments, the system controller 830 executes system control software.

In some cases, the system controller 830 controls gas concentration, wafer movement, and/or the power supplied to the coils 833 and/or electrostatic chuck 817. The system controller 830 may control the gas concentration by, for example, opening and closing relevant valves to produce one or more inlet gas stream that provide the reactant(s) at the proper concentration(s). The wafer movement may be controlled by, for example, directing a wafer positioning system to move as desired. The power supplied to the coils 833 and/or chuck 817 may be controlled to provide particular RF power levels. Similarly, if the internal grid 850 is used, any RF power applied to the grid may be adjusted by the system controller 830.

The system controller 830 may control these and other aspects based on sensor output (e.g., when power, potential, pressure, etc. reach a certain threshold), the timing of an operation (e.g., opening valves at certain times in a process), or based on received instructions from the user. An example controller is further discussed below.

Figure 9:
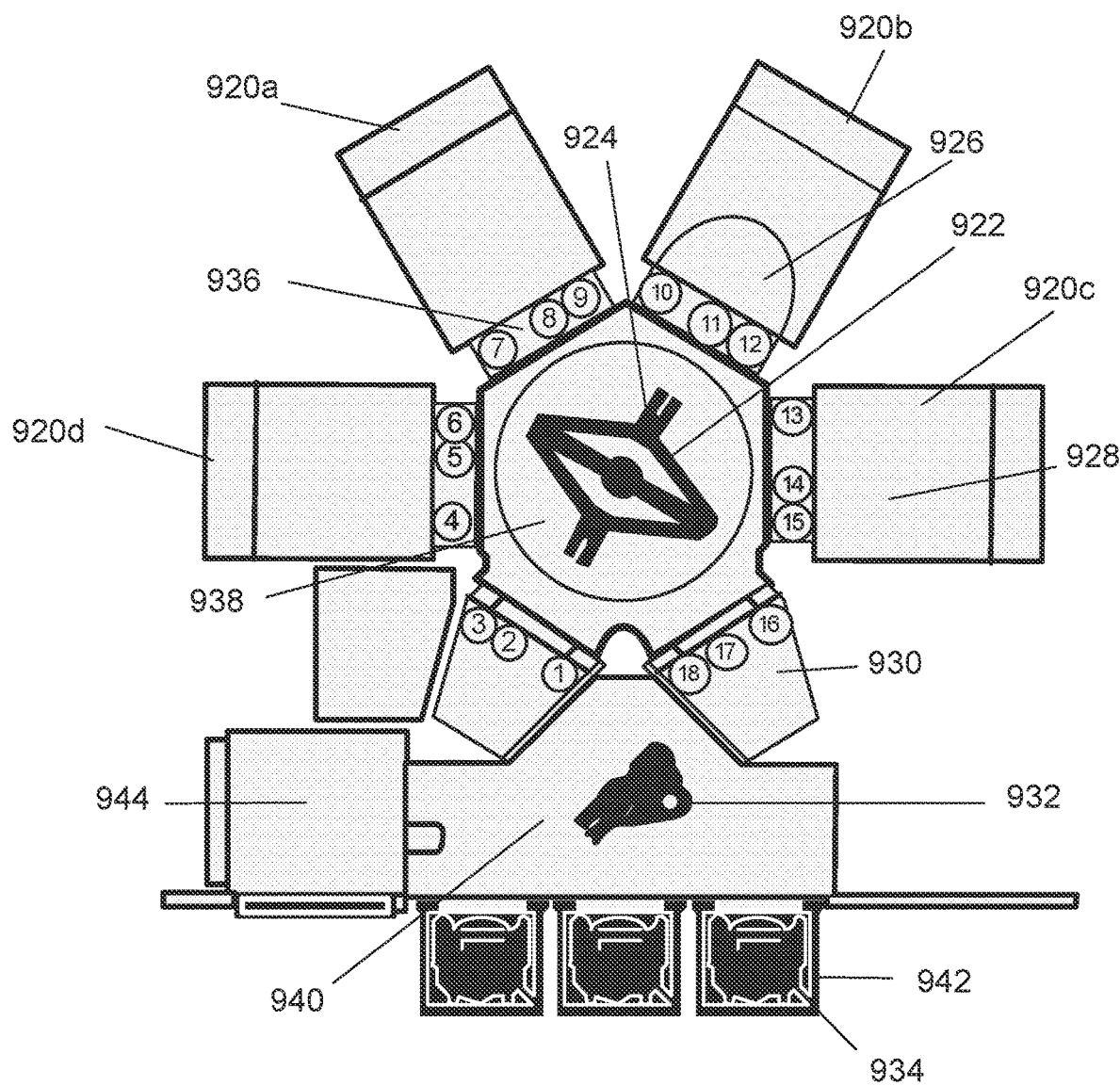
FIG. 9 illustrates a semiconductor process cluster architecture with a number of modules, each of which may be configured to deposit and/or etch the various layers described herein.

FIG. 9 depicts a semiconductor process cluster architecture with various modules that interface with a vacuum transfer module 938 (VTM). The arrangement of transfer modules to "transfer" wafers among multiple storage facilities and processing modules may be referred to as a "cluster tool architecture" system. Airlock 930, also known as a loadlock or transfer module, is shown in VTM 938 with four processing modules 920a-920d, which may be individually optimized to perform various fabrication processes. By way of example, processing modules 920a-920d may be implemented to perform substrate etching, deposition, ion implantation, wafer cleaning, sputtering, and/or other semiconductor processes. One or more of the substrate etching processing modules (any of 920a-920d) may be implemented as disclosed herein. Airlock 930 and process module 920 may be referred to as "stations." Each station has a facet 936 that interfaces the station to VTM 938. Inside each facet, sensors 1-18 are used to detect the passing of wafer 926 when moved between respective stations.

Robot 922 transfers wafer 926 between stations. In one embodiment, robot 922 has one arm, and in another embodiment, robot 922 has two arms, where each arm has an end effector 924 to pick wafers such as wafer 926 for transport. Front-end robot 932, in atmospheric transfer module (ATM) 940, is used to transfer wafers 926 from cassette or Front Opening Unified Pod (FOUP) 934 in Load Port Module (LPM) 942 to airlock 930. Module center 928 inside process module 920 is one location for placing wafer 926. Aligner 944 in ATM 940 is used to align wafers.

In an exemplary processing method, a wafer is placed in one of the FOUPs 934 in the LPM 942. Front-end robot 932 transfers the wafer from the FOUP 934 to an aligner 944, which allows the wafer 926 to be properly centered before it is etched or processed. After being aligned, the wafer 926 is moved by the front-end robot 932 into an airlock 930. Because airlock modules have the ability to match the environment between an ATM and a VTM, the wafer 926 is able to move between the two pressure environments without being damaged. From the airlock module 930, the wafer 926 is moved by robot 922 through VTM 938 and into one of the process modules 920a-920d. In order to achieve this wafer movement, the robot 922 uses end effectors 924 on each of its arms. Once the wafer 926 has been processed, it is moved by robot 922 from the process modules 920a-920d to an airlock module 930. From here, the wafer 926 may be moved by the front-end robot 932 to one of the FOUPs 934 or to the aligner 944.

It should be noted that the computer controlling the wafer movement can be local to the cluster architecture, or can be located external to the cluster architecture in the manufacturing floor, or in a remote location and connected to the cluster architecture via a network.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate, the method comprising:
    a. receiving a substrate comprising:
        i. underlying material,
        ii. an organic planarizing layer positioned over the underlying material,
        iii. a multi-layer hardmask positioned over the organic planarizing layer, the multi-layer hardmask comprising:
            1. A lower layer comprising an inorganic dielectric silicon-containing material, and
            2. An upper layer comprising a metal oxide, a metal nitride, or a metal oxynitride, and
        iv. a layer of extreme ultraviolet (EUV) photoresist positioned over the multi-layer hardmask, wherein the layer of EUV photoresist is patterned to include recessed features, and wherein portions of the upper layer of the multi-layer hardmask are exposed within the recessed features;
    b. etching the exposed portions of the upper layer of the multi-layer hardmask, thereby extending the recessed features into the upper layer of the multi-layer hardmask and exposing portions of the lower layer of the multi-layer hardmask;
    c. etching the exposed portions of the lower layer of the multi-layer hardmask, thereby extending the recessed features into the lower layer of the multi-layer hardmask and exposing portions of the organic planarizing layer;
    d. etching the exposed portions of the organic planarizing layer, thereby extending the recessed features into the organic planarizing layer and exposing portions of the underlying material; and
    e. etching the exposed portions of the underlying material, thereby extending the recessed features into the underlying material.

2. The method of claim 1, wherein the lower layer of the multi-layer hardmask comprises a material selected from the group consisting of: amorphous silicon, silicon oxide, silicon carbide, silicon oxycarbide, silicon nitride, silicon oxynitride, and combinations thereof.

3. The method of claim 1, wherein the lower layer of the multi-layer hardmask has a thickness of about 10 nm or less.

4. The method of claim 1, wherein the metal oxide, metal nitride, or metal oxynitride of the upper layer of the multi-layer hardmask comprises a metal selected from the group consisting of: titanium, tantalum, hafnium, tin, ruthenium, and combinations thereof.

5. The method of claim 1, wherein the upper layer of the multi-layer hardmask has a thickness of about 10 nm or less.

6. The method of claim 1, further comprising:
    before (b), exposing the substrate to a first plasma to remove excess EUV photoresist within the recessed features.

7. The method of claim 1, wherein etching the exposed portions of the upper layer of the multi-layer hardmask comprises exposing the substrate to a second reactant, the second reactant comprising a chlorine-containing etchant and/or a bromine-containing reactant.

8. The method of claim 1, wherein etching exposed portions of the upper layer of the multi-layer hardmask comprises exposing the substrate to a second plasma.

9. The method of claim 1, wherein etching the exposed portions of the lower layer of the multi-layer hardmask comprises exposing the substrate to a third reactant, the third reactant comprising a fluorine-containing reactant and/or a chlorine-containing reactant.

10. The method of claim 1, wherein etching the exposed portions of the lower layer of the multi-layer hardmask comprises exposing the substrate to a third plasma.

11. The method of 1, wherein both the upper layer and the lower layer of the multi-layer hardmask each have thicknesses of about 10 nm or less.

12. The method of 1, wherein the underlying material comprises an oxide layer positioned under the organic planarizing layer, a titanium nitride layer or a titanium oxynitride layer positioned under the oxide layer, and a silicon nitride layer positioned under the titanium nitride layer or titanium oxynitride layer, wherein etching the exposed portions of the underlying material extends the recessed features into the oxide layer and into the titanium nitride layer or the titanium oxynitride layer, and wherein the etching in at least (b) and (c) are driven by an inductively coupled plasma.

13. The method of claim 12, further comprising removing the organic planarizing layer after the recessed features are extended into the oxide layer and the titanium nitride layer or titanium oxynitride layer.

14. The method of 1, wherein the underlying material comprises a sacrificial hardmask layer positioned under the organic planarizing layer, an ultra-low k dielectric layer positioned below the sacrificial hardmask layer, and a cap layer positioned under the ultra-low k dielectric layer, wherein etching exposed portions of the underlying material extends the recessed features into the sacrificial hardmask layer, the ultra-low k dielectric layer, and the cap layer, wherein the etching in at least (b) and (c) are driven by a capacitively coupled plasma.

15. The method of claim 14, wherein the sacrificial hardmask layer comprises silicon nitride.

16. The method of claim 14, further comprising removing the organic planarizing layer after the recessed features are extended into the sacrificial hardmask layer, the ultra-low k dielectric layer, and the cap layer.

17. An apparatus for processing substrates, the apparatus comprising:
   a. a reaction chamber;
   b. a substrate support positioned within the reaction chamber;
   c. a plasma generator configured to generate a plasma within the reaction chamber;
   d. one or more inlets to the reaction chamber; and
   e. a controller having at least one processor and a memory, wherein the at least one processor and the memory are communicatively connected with one another, and the memory stores computer-executable instructions for controlling the at least one processor to cause the method of claim 1.

18. An apparatus for processing a substrate, the apparatus comprising:
   a. a reaction chamber;
   b. a substrate support positioned within the reaction chamber;
   c. a plasma generator configured to generate a plasma within the reaction chamber;
   d. one or more inlets to the reaction chamber; and
   e. a controller having at least one processor and a memory, wherein the at least one processor and the memory are communicatively connected with one another, and the memory stores computer-executable instructions for controlling the at least one processor to cause:
      i. receiving the substrate in the reaction chamber, the substrate comprising:
         1. Underlying material,
         2. An organic planarizing layer positioned over the underlying material,
         3. A multi-layer hardmask positioned over the organic planarizing layer, the multi-layer hardmask comprising:
            a. a lower layer comprising an inorganic dielectric silicon-containing material, and
            b. an upper layer comprising a metal oxide, a metal nitride, or a metal oxynitride, and
         4. A layer of extreme ultraviolet (EUV) photoresist positioned over the multi-layer hardmask, wherein the layer of EUV photoresist is patterned to include recessed features, and wherein portions of the upper layer of the multi-layer hardmask are exposed within the recessed features;
      ii. etching the exposed portions of the upper layer of the multi-layer hardmask, thereby extending the recessed features into the upper layer of the multi-layer hardmask and exposing portions of the lower layer of the multi-layer hardmask;
      iii. etching the exposed portions of the lower layer of the multi-layer hardmask, thereby extending the recessed features into the lower layer of the multi-layer hardmask and exposing portions of the organic planarizing layer;
      iv. etching the exposed portions of the organic planarizing layer, thereby extending the recessed features into the organic planarizing layer and exposing portions of the underlying material; and
      v. etching the exposed portions of the underlying material, thereby extending the recessed features into the underlying material.

19. A system for processing substrate, the system comprising:
   a. a first reaction chamber configured to perform deposition;
   b. a second reaction chamber configured to perform etching; and
   c. a controller having at least one processor and a memory, wherein the at least one processor and the memory are communicatively connected with one another, and the memory stores computer-executable instructions for controlling the at least one processor to cause:
      i. receiving a substrate in the first reaction chamber,
      ii. depositing a lower layer of a multi-layer hardmask on the substrate, wherein the lower layer of the multi-layer hardmask comprises an inorganic dielectric silicon-containing material,
      iii. depositing an upper layer of the multi-layer hardmask on the lower layer of the multi-layer hardmask, wherein the upper layer of the multi-layer hardmask comprises a metal oxide, a metal nitride, or a metal oxynitride,
      iv. depositing a layer of extreme ultraviolet photoresist above the upper layer of the multi-layer hardmask,
      v. patterning the layer of extreme ultraviolet photoresist to define recessed features, thereby exposing portions of the upper layer of the multi-layer hardmask,
      vi. transferring the substrate to the second reaction chamber;
      vii. etching the exposed portions of the upper layer of the multi-layer hardmask, thereby extending the recessed features into the upper layer of the multi-layer hardmask and exposing portions of the lower layer of the multi-layer hardmask; and
      viii. etching the exposed portions of the lower layer of the multi-layer hardmask, thereby extending the recessed features into the lower layer of the multi-layer hardmask and exposing portions of the substrate positioned under the lower layer of the multi-layer hardmask.

20. The system of claim 19, wherein the second reaction chamber comprises an inductively coupled plasma generator, and wherein the memory stores computer-executable instructions for controlling the at least one processor to cause generating a first inductively coupled plasma to etch the exposed portions of the upper layer of the multi-layer hardmask in (vii) and to cause generating a second inductively coupled plasma to etch the exposed portions of the lower layer of the multi-layer hardmask in (viii).

21. The system of claim 19, wherein the second reaction chamber comprises a capacitively coupled plasma generator, and wherein the memory stores computer-executable instructions for controlling the at least one processor to cause generating a first capacitively coupled plasma to etch the exposed portions of the upper layer of the multi-layer hardmask in (vii) and to cause generating a second capacitively coupled plasma to etch the exposed portions of the lower layer of the multi-layer hardmask in (viii).

* * * * *